(12) United States Patent
Englekirk et al.

(10) Patent No.: US 10,546,747 B2
(45) Date of Patent: *Jan. 28, 2020

(54) MANAGED SUBSTRATE EFFECTS FOR STABILIZED SOI FETS

(71) Applicant: pSemi Corporation, San Diego, CA (US)

(72) Inventors: Robert Mark Englekirk, Littleton, CO (US); Keith Bargroff, San Diego, CA (US); Christopher C. Murphy, Lake Zurich, IL (US); Tero Tapio Ranta, San Diego, CA (US); Simon Edward Willard, Irvine, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/167,424

(22) Filed: Oct. 22, 2018

(65) Prior Publication Data

US 2019/0057868 A1 Feb. 21, 2019

Related U.S. Application Data

(63) Continuation of application No. 15/600,588, filed on May 19, 2017, now Pat. No. 10,276,371.

(51) Int. Cl.
*H01L 29/06* (2006.01)
*H01L 21/02* (2006.01)
(Continued)

(52) U.S. Cl.
CPC ...... *H01L 21/02658* (2013.01); *H01L 21/265* (2013.01); *H01L 21/3226* (2013.01);
(Continued)

(58) Field of Classification Search
CPC ..... H01L 29/06; H01L 29/0649; H01L 29/16; H01L 29/1608; H01L 29/2003;
(Continued)

(56) References Cited

U.S. PATENT DOCUMENTS 6,593,799 B2 7/2003 De et al.
7,910,993 B2 3/2011 Brindle
(Continued)

FOREIGN PATENT DOCUMENTS

EP 2814053 12/2014
EP 3203507 8/2017
(Continued)

OTHER PUBLICATIONS

Inoussa, Mouloucoulay, Final Office Action received from the USPTO dated Jan. 18, 2019 for U.S. Appl. No. 15/488,367, 41 pgs.
(Continued)

*Primary Examiner* — Chuong A Luu
(74) *Attorney, Agent, or Firm* — Jaquez Land Greenhaus LLP; John Land, Esq.

(57) ABSTRACT

Modified silicon-on-insulator (SOI) substrates having a trap rich layer, and methods for making such modifications. The modified regions eliminate or manage accumulated charge that would otherwise arise because of the interaction of the underlying trap rich layer and active layer devices undergoing transient changes of state, thereby eliminating or mitigating the effects of such accumulated charge on non-RF integrated circuitry fabricated on such substrates. Embodiments retain the beneficial characteristics of SOI substrates with a trap rich layer for RF circuitry requiring high linearity, such as RF switches, while avoiding the problems of a trap rich layer for circuitry that is sensitive to accumulated charge effects caused by the presence of the trap rich layer,
(Continued)

such as non-RF analog circuitry and amplifiers (including power amplifiers and low noise amplifiers).

20 Claims, 18 Drawing Sheets

(51) Int. Cl.
  *H01L 21/8234* (2006.01)
  *H01L 21/322* (2006.01)
  *H01L 21/265* (2006.01)
  *H01L 21/762* (2006.01)
  *H01L 27/12* (2006.01)

(52) U.S. Cl.
  CPC .. *H01L 21/7624* (2013.01); *H01L 21/823481* (2013.01); *H01L 27/1218* (2013.01); *H01L 29/0649* (2013.01)

(58) Field of Classification Search
  CPC ......... H01L 29/20; H01L 27/00; H01L 27/12; H01L 27/1203; H01L 27/1207
  USPC ........................................................ 257/401
  See application file for complete search history.

(56) References Cited

U.S. PATENT DOCUMENTS

| | | | |
|---|---|---|---|
| 9,472,512 | B1 | 10/2016 | Toh et al. |
| 9,530,798 | B1 | 12/2016 | Chou et al. |
| 9,755,029 | B1 | 9/2017 | Goktepeli |
| 2002/0125921 | A1 | 9/2002 | Van Wershoven |
| 2004/0077327 | A1 | 4/2004 | Lim et al. |
| 2004/0129977 | A1 | 7/2004 | Ohkubo et al. |
| 2004/0245975 | A1 | 12/2004 | Tran et al. |
| 2006/0011807 | A1 | 1/2006 | Lee et al. |
| 2011/0304393 | A1 | 12/2011 | Luff |
| 2012/0146193 | A1 | 6/2012 | Stuber et al. |
| 2013/0270678 | A1 | 10/2013 | Rankin et al. |
| 2014/0191322 | A1 | 7/2014 | Botula et al. |
| 2015/0255368 | A1 | 9/2015 | Costa |
| 2015/0280655 | A1 | 10/2015 | Nobbe et al. |
| 2016/0035899 | A1 | 2/2016 | Stulemeijer et al. |
| 2016/0241235 | A1 | 8/2016 | Hasegawa |
| 2017/0005111 | A1 | 1/2017 | Verma et al. |
| 2017/0133989 | A1 | 5/2017 | Dykstra et al. |
| 2017/0170177 | A1 | 6/2017 | Tasbas |
| 2018/0053784 | A1 | 2/2018 | Cai et al. |
| 2018/0262164 | A1 | 9/2018 | Ranta et al. |
| 2018/0337043 | A1* | 11/2018 | Englekirk ......... H01L 21/02658 |
| 2018/0337146 | A1 | 11/2018 | Englekirk et al. |

FOREIGN PATENT DOCUMENTS

| | | |
|---|---|---|
| JP | 2017174846 | 9/2017 |
| WO | 2011008893 | 1/2011 |
| WO | 2018212975 | 11/2018 |
| WO | 2018212976 | 11/2018 |

OTHER PUBLICATIONS

Luu, Chuong A., Notice of Allowance received from the USPTO dated Feb. 21, 2019 for U.S. Appl. No. 15/600,588, 10 pgs.
Juhl, Andreas, Written Opinion of the International Preliminary Examining Authority received from the EPO dated Apr. 3, 2019 for appln. No. PCT/US2018/030191, 5 pgs.
Simon, Volker, Written Opinion of the International Preliminary Examining Authority received from the EPO dated Apr. 5, 2019 for appln. No. PCT/US2018/030179, 7 pgs.
Luu, Chuong A., Office Action received from the USPTO dated Jan. 4, 2018 for U.S. Appl. No. 15/600,588, 7 pgs.
Luu, Chuong A., Office Action received from the USPTO dated Feb. 9, 2018 for U.S. Appl. No. 15/600,588, 15 pgs.
Luu, Chuong A., Office Action received from the USPTO dated Jun. 1, 2018 for U.S. Appl. No. 15/600,588, 13 pgs.
Luu, Chuong A., Office Action received from the USPTO dated Nov. 8, 2018 for U.S. Appl. No. 15/600,588, 16 pgs.
Englekirk, et al., Response filed in the USPTO dated Jan. 10, 2018 for U.S. Appl. No. 15/600,588, 8 pgs.
Englekirk, et al., Response filed in the USPTO dated Feb. 26, 2018 for U.S. Appl. No. 15/600,588, 8 pgs.
Englekirk, et al., Response filed in the USPTO dated Jul. 16, 2018 for U.S. Appl. No. 15/600,588, 4 pgs.
Englekirk, et al., Response filed in the USPTO dated Nov. 9, 2018 for U.S. Appl. No. 15/600,588, 6 pgs.
Nguyen, Patricia T., Notice of Allowance received from the USPTO dated Jul. 15, 2019 for U.S. Appl. No. 16/283,298, 8 pgs.
Retebo, Metasebia T., Final Office Action received from the USPTO dated Jul. 26, 2019 for U.S. Appl. No. 15/600,579, 22 pgs.
Simon, Volker, International Preliminary Report on Patentability received from the EPO dated Aug. 12, 2019 for appln. No. PCT/US2018/030179, 19 pgs.
Juhl, Andreas, International Preliminary Report on Patentability received from the EPO dated Aug. 23, 2019 for appln. No. PCT/US2018/030191, 23 pgs.
Huynh, Andy, Office Action received from the USPTO dated Sep. 9, 2019 for U.S. Appl. No. 16/040,295, 5 pgs.
Wirner, Christoph, International Search Report and Written Opinion received from EPO dated Oct. 22, 2019 for appln. No. PCT/US2019/041898, 11 pgs.
Topol, et al., "Enabling SOI-Based Assembly Technology for Three-Dimensional (3D) Integrated Circuits (ICs)", International Electron Devices Meeting 2005, Dec. 5, 2005.
Huynh, Andy, Office Action received from the USPTO dated Oct. 25, 2019 for U.S. Appl. No. 16/040,295, 41 pgs.

* cited by examiner

MANAGED SUBSTRATE EFFECTS FOR STABILIZED SOI FETS

CROSS-REFERENCE TO RELATED APPLICATIONS—CLAIM OF PRIORITY

This application is a continuation of commonly owned and co-pending U.S. patent application Ser. No. 15/600,588, filed May 19, 2017, entitled "Managed Substrate Effects for Stabilized SOI FETs", the disclosure of which is incorporated herein by references in its entirety.

This application may be related to U.S. patent application Ser. No. 15/600,579, filed May 19, 2017, entitled "Transient Stabilized SOI FETs", to U.S. patent application Ser. No. 14/964,412, filed Dec. 9, 2015, entitled "S-Contact for SOI", to U.S. patent application Ser. No. 15/385,618, filed Dec. 20, 2016, entitled "Systems, Methods and Apparatus for Enabling High Voltage Circuits", and to U.S. patent application Ser. No. 15/268,297, filed Sep. 16, 2016, entitled "Standby Voltage Condition for Fast RF Amplifier Bias Recovery", all assigned to the assignee of the present invention and hereby incorporated by reference.

BACKGROUND

(1) Technical Field

The invention relates to electronic circuits, and more particularly to radio frequency circuitry fabricated with silicon-on-insulator technology.

(2) Background

Modern radio frequency (RF) transceivers have become ubiquitous, with manifestations found in cellular telephones, wireless networks (e.g., WiFi, Bluetooth), laptop computers, tablets, computer peripheral devices (e.g., printers, keyboards, mice), etc. That ubiquity has increased demand for smaller and lower power RF transceiver circuit designs.

FIG. 1 is a block diagram of a typical prior art transceiver 100 such as the type that might be used in a cellular telephone. As illustrated, the transceiver 100 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the lines between sections may be blurred).

The receiver path Rx receives over-the-air RF signals through an antenna 102 and a switching unit 104, which may be implemented with active switching devices (e.g., field effect transistors or FETs), or with passive devices that implement frequency-domain multiplexing, such as a diplexer or duplexer. An RF filter 106 passes desired received RF signals to a low noise amplifier (LNA) 108, the output of which is combined in a mixer 110 with the output of a first local oscillator 112 to produce an intermediate frequency (IF) signal. The IF signal may be amplified by an IF amplifier 114 and subjected to an IF filter 116 before being applied to a demodulator 118, which may be coupled to a second local oscillator 120. The output of the demodulator 118 is transformed to a digital signal by an analog-to-digital converter 122 and provided to one or more system components 124 (e.g., a video graphics circuit, a sound circuit, memory devices, etc.). The converted digital signal may represent, for example, images (video or still), sounds, or symbols, such as text or other characters.

In the illustrated example, a transmitter path Tx includes Baseband, Back-End, IF Block, and RF Front End sections (again, in some implementations, the lines between sections may be blurred). Digital data from one or more system components 124 is transformed to an analog signal by a digital-to-analog converter 126, the output of which is applied to a modulator 128, which also may be coupled to the second local oscillator 120. The output of the modulator 128 may be subjected to an IF filter 130 before being amplified by an IF amplifier 132. The output of the IF amplifier 132 is then combined in a mixer 134 with the output of the first local oscillator 112 to produce an RF signal. The RF signal may be amplified by a driver 136, the output of which is applied to a power amplifier (PA) 138. The amplified RF signal may be coupled to an RF filter 140, the output of which is coupled to the antenna 102 through the switching unit 104.

The operation of the transceiver 100 is controlled by a microprocessor 142 in known fashion, which interacts with system control components (e.g., user interfaces, memory/storage devices, application programs, operating system software, power control, etc.). In addition, the transceiver 100 will generally include other circuitry, such as bias circuitry 146 (which may be distributed throughout the transceiver 100 in proximity to transistor devices), electro-static discharge (ESD) protection circuits (not shown), testing circuits (not shown), factory programming interfaces (not shown), etc.

As should be apparent to one of ordinary skill in the art, some components of the transceiver 100 may be positioned in a different order (e.g., filters), and some of the components may be implemented as distinct integrated circuits (ICs). For example, the RF front end may be separately embodied from the rest of the circuitry (although there is a trend to try to integrate as much of the transceiver functionality as possible in a single IC). Other components can be (and usually are) added (e.g., additional filters, impedance matching networks, variable phase shifters/attenuators, power dividers, etc.). Importantly, in modern transceivers, there are often more than one receiver path Rx and transmitter path Tx—for example, to accommodate multiple frequencies and/or signaling modalities—so switching and control becomes more complex.

A challenge with electronic circuit design in general is that ideal components do not exist, particularly when dealing with RF signals. For example, the operational characteristics of many passive and active components in an RF signal path are frequency dependent. As another example, a significant problem with RF circuit design is eliminating or controlling unwanted cross-effects ("cross-talk") and self-effects, such as parasitic capacitances and inductances, undesired signal coupling, performance changes due to environment temperature changes as well as self-heating, and others. The problems of RF design become more acute when embodying RF circuits as ICs, where components materials, circuit juxtaposition, and power constraints add to the difficulties of optimizing operational parameters for all components. As one example, FETs are inherently designed to operate with fields, but fields do not have distinct edges and often cause cross-effects and self-effects. As another example, FETs have operating parameters that are subject to process, voltage, and temperature (PVT) variations. Accordingly, RF circuit designs embodied as ICs generally require optimizations of some circuit parameters at the expense of other parameters.

As an example of such trade-offs, as noted above, a transceiver 100 will generally include bias circuitry. FIG. 2 is a block diagram of a prior art bias voltage generation circuit 200. In this example, a stable reference voltage source 202 provides a reference voltage $V_{BG}$. The reference voltage source 202 may be, for example, a band-gap voltage reference, which is a temperature-independent voltage reference circuit widely used in ICs that produces an essentially constant voltage regardless of power supply variations, temperature changes, and load. The reference voltage $V_{BG}$ is applied to a voltage-to-current converter circuit 204, which essentially divides the reference voltage $V_{BG}$ by a resistance R to generate a reference current $I_{REF}$. The reference current $I_{REF}$ may be applied to a bias generator circuit 206 which generates a specific bias voltage $V_{BIAS}$ suitable for a particular amplifier 208. The bias generator circuit 206 may be simple or complex, depending on the needs of the overall circuit; examples of a variety of bias generator circuits are described in U.S. patent application Ser. No. 15/268,229, filed Sep. 16, 2016, entitled "Cascode Amplifier Bias Circuits", assigned to the assignee of the present invention and hereby incorporated by reference.

A notable characteristic of RF circuits in general is that different components may require different optimizations. For example, the amplifier 208 is in the RF signal path and is generally an analog circuit optimized for performance at RF frequencies. Conversely, while the components of the bias voltage generation circuit 200 are also generally analog circuitry, they generally do not operate at RF frequencies and they may need optimizations that differ from RF signal path components. A distinct challenge of RF circuit design is that optimization for some circuitry may adversely affect optimization of other circuitry.

In general, for most transceivers, the RF signal path components are the most important circuitry to optimize. It was recognized some time ago that semiconductor-on-insulator (SOI) IC technology is particularly useful for such optimization. An important aspect of SOI technology is that the semiconductor region in which circuitry is formed is isolated from the bulk substrate by an electrically insulating layer. An advantage of isolating circuitry from the bulk substrate is a dramatic decrease in cross-talk and parasitic capacitance, which significantly improves speed and power characteristics for RF components.

FIG. 3 is block diagram showing a typical prior art SOI IC structure 300 for a single FET. The SOI structure 300 includes a substrate 302, an insulator layer 304, and an active layer 306. The substrate 302 is typically a semiconductor material such as silicon. The insulator layer 304 is a dielectric which is often silicon dioxide formed through the oxidation of a silicon substrate 302; the insulator layer 304 is often referred to as a buried oxide (or "BOX") layer. The active layer 306 may include some combination of implants and/or layers that include dopants, dielectrics, polysilicon, metal wiring, passivation, and other materials to form active and/or passive electronic components and/or mechanical structures. For example, in the illustrated embodiment, a FET is shown comprising a source S, a drain D, and a gate G atop an insulating layer 308. Additional elements, not shown, may include contacts, conductive interconnections to other components and/or external connections, and protective coatings.

While the basic SOI IC structure 300 of FIG. 3 works reasonably well up to a point for RF circuitry such as transceiver components, as frequency increases and power specifications are reduced, cross-talk and parasitic elements again begin to affect such parameters as linearity and switching speed. Accordingly, other optimizations may be required. For example, FIG. 4 is block diagram showing an improved prior art SOI IC structure 400 for a single FET. The SOI structure 400 includes a high resistivity substrate 402, a trap rich layer 404, a BOX insulator layer 406, and an active layer 408 that includes a single example FET 410.

The high resistivity of the substrate 402 makes the impedance of the parasitic paths through the substrate 402 higher. Materials used for the high resistivity substrate 402 typically include very lightly doped silicon such that the high resistivity substrate 402 takes on some of the characteristics of an insulator. The use of high resistivity substrates alone has proven capable of extending the benefit of SOI structures for RF communication circuits by roughly two orders of frequency magnitude.

The trap rich layer 404 is a solution to another problem. Although high resistivity substrates alone are capable of reducing substrate loss when used in SOI IC structures, they are highly susceptible to another phenomenon called parasitic surface conduction. The problem of parasitic surface conduction occurs because the high resistivity substrate 402 is capable of terminating field lines, but a thin surface region of the high resistivity substrate 402 can be formed into an inversion or accumulation region as charge carriers are affected by changes in signal voltages in the active layer 408. The degree to which charge carriers in the thin surface region are displaced is directly altered by signals in the active layer 408. As a result, without the trap layer 404, the capacitance of the junction between the high resistivity substrate 402 and the active layer 408, as seen by the active layer 408, depends on the voltage applied, resulting in nonlinearity and a loss of signal purity. In addition, an applied voltage can invert this interface on the side of the high resistivity substrate 402 and create a channel-like layer within the thin surface region where charge can move very easily in a lateral direction despite the fact that the substrate layer 402 is highly resistive. Therefore, this effect can also lead to signal-degrading cross-talk in RF communication circuits.

Forming a trap rich layer 404 on top of the substrate layer 402 substantially mitigates parasitic surface conduction. The trap rich layer 404 is typically formed as a layer of amorphous or polycrystalline silicon on a top surface of the substrate 402, and significantly degrades the mobility of the charge carriers in the thin surface region of the substrate 402. Since the carriers cannot travel far, the effective resistance of the substrate 402 is preserved and the capacitance as seen by the active layer 408 is not as dependent upon the signals in the active layer 408. The improved RF performance of SOI IC substrates with a trap rich layer 404 is so marked that wafers having that configuration are commercially available.

Thus, SOI based IC technology improves RF performance, to a point; high resistivity SOI substrates further improve RF performance, to a point; and high resistivity SOI substrates with trap rich layers further still improves RF performance. However, the improved performance of SOI-based RF circuitry formed in the active layer 408 above the trap rich layer 404 can adversely affect desired operational characteristics of non-RF circuitry formed in the active layer 408 above the trap rich layer 404, such as switches and bias circuits.

For example, for some components (e.g., a power amplifier for use in a WiFi transceiver, such as one conforming to the IEEE 802.11ax or 802.11ac standards), the component is active for only short bursts of time (e.g., ~4 mS in a WiFi power amplifier) and in a low power mode (e.g., "sleep" or "standby" mode) for most of the time to save power. In the WiFi example, the standby power consumption for a power amplifier may be very low (e.g., <10 μA), but the amplifier may be required to have a very quick sleep-to-active transition time (e.g., <1 μS) and to achieve a very stable gain very soon (e.g., <30 μS) after becoming active. The low power standby mode may be achieved by essentially switching some of the active circuitry OFF. More generally, many radio-based systems, particularly battery-operated systems (e.g., cellular telephones and WiFi radios) make significant use of standby modes to conserve power usage and/or to preserve battery life. Transitioning from a standby mode to an active mode introduces transient effects, especially in bias circuits, which can take a long time to settle out. However, many RF and analog performance requirements typically do not allow a lot of recovery ("buffer") time. In general, such radio systems are designed to start transmitting a maximum amount of data as soon as possible. This requires that the radio system waken from standby mode back to active mode and be ready for full performance without significant transient effects.

Compounding the challenges of IC design is the fact that an SOI FET can develop an accumulated charge over time. For example, one type of accumulated charge depends upon the potentials at the source S, drain D, and gate G of the FET 410. More particularly, when used in certain SOI circuit implementations, conventional FETs may operate in an accumulated charge regime. This phenomenon is also referred to as a "floating body effect" or "kink effect", and more generally is the effect of dependence of the body potential of an SOI FET on the history of its biasing and carrier recombination processes. The body of the FET forms a capacitor with respect to the insulated substrate, and accordingly charge accumulates on this capacitor. The accumulated charge may cause adverse effects, such as opening of parasitic transistors in the structure and causing OFF-state leakages (resulting in higher current consumption), and also causes a history effect, which is the dependence of the threshold voltage $V_{TH}$ of a FET on the previous states of the FET.

Another aspect of accumulated charge is related to the OFF state of a FET and the resultant effect on device linearity, and is described in U.S. Pat. No. 7,910,993 B2, issued Mar. 22, 1011, entitled "Method and Apparatus for use in Improving Linearity of MOSFET'S using an Accumulated Charge Sink" and assigned to the assignee of the present invention.

A trap rich layer 404 on an SOI substrate 402 can be a separate source of accumulated charge. For example, when FETs in the active layer switch between ON and OFF states, the changing electrical fields accompanying such change in state can cause charge to accumulate between the trap rich layer 404 and the BOX insulator layer 406. The high impedance nature of the trap rich layer 404 hinders dissipation of that trapped accumulated charge.

Regardless of source, accumulated charge can take a long time to equilibrate (e.g., >4 mS), and can affect the intrinsic properties of a FET device (e.g., the threshold voltage of the device, $V_{TH}$). Thus, turning most or all switch FETs OFF to achieve a standby mode power level specification—as in the WiFi example above—results in accumulated charge in or near the trap rich layer 404 which takes time to dissipate when the FETs are turned back ON to the point of stable gain; that time may exceed a required sleep-to-active transition specification.

Anything that affects the operating point of a FET (e.g., $V_{TH}$, biasing, current $I_{DS}$, etc.) generally adversely impacts the performance of circuits based on such devices, such as the gain stability of an amplifier circuit. Because of the accumulated charge phenomenon, SOI FETs essentially have "memory": that is, changing the operating point of a FET involves also settling the body of the FET and the substrate to a new potential. Further, neighboring FETs and charged nodes can affect the intrinsic properties of a FET. Under such conditions, turning a FET completely OFF and then getting it to turn ON and be completely stable immediately is quite challenging.

Even providing substrate contacts (S-contacts) to mitigate accumulated charges of various types, as taught in U.S. patent application Ser. No. 14/964,412 referenced above, does not fully mitigate the problem during operation (even if the contacts are ohmic), due to the high resistivity of the substrate 402 restricting the flow of charge. Moreover, anything coupling to the substrate 402 may change its potential, thereby affecting nearby FET devices.

Prior attempts to mitigate the accumulated charge problem for FETs fabricated on SOI substrates having a trap rich layer include improving the effectiveness of body ties (such as by interspersing ties on the source side of a FET), using shorter width and/or longer length FETs to lessen accumulated charge (noting that longer length FETs generally do not work for power amplifiers), or adopting process techniques to reduce body-tie resistance. Attempts have also been made at the circuit level to compensate for the effects of the accumulated charge problem (rather than actually mitigate the problem), such as by creating replica circuits to try to track out gain variation due to accumulated charge. However, such circuit specific solutions are generally inadequate as a general solution.

Accordingly, there is a need for methods and structures that eliminate or reduce the formation of accumulated charge in SOI substrates having a trap rich layer, or which mitigate the effects of accumulated charge on the performance of FETs fabricated on SOI substrates having a trap rich layer. The present invention addresses these and other needs.

SUMMARY OF THE INVENTION

The invention encompasses several types of modifications in selected regions to silicon-on-insulator (SOI) substrates having a trap rich layer, and methods for making such modifications. The modified regions eliminate or manage accumulated charge that would otherwise arise because of the interaction of the underlying trap rich layer and active layer devices undergoing transient changes of state, thereby eliminating or mitigating the effects of such accumulated charge on non-RF integrated circuitry fabricated on such substrates.

In specific applications, use of one or more embodiments of the present invention lowers standby power consumption of FETs while enabling a very quick sleep-to-active transition time (e.g., <1 μS) and achieving a very stable gain very soon after becoming active.

Accordingly, embodiments of the present invention retain the beneficial characteristics of SOI substrates with a trap rich layer for RF circuitry requiring high linearity, such as RF switches, while avoiding the problems of a trap rich layer for circuitry that is sensitive to accumulated charge effects caused by the presence of the trap rich layer, such as non-RF analog circuitry and amplifiers (including power amplifiers and low noise amplifiers).

In a first embodiment, a trap rich layer is selectively formed on a high resistivity substrate.

In a second embodiment, characteristics of a trap rich layer are modified before formation of a BOX insulator layer.

In a third embodiment, characteristics of a trap rich layer are modified after formation of a BOX insulator layer (and optionally after formation of an active layer).

In a fourth embodiment, characteristics of a trap rich layer are modified after formation of a BOX insulator layer (and optionally after formation of an active layer) by using a laser annealing process.

In a fifth embodiment, a trap rich layer of a pre-fabricated SOI wafer is modified by removal of selected regions of the trap rich layer.

In a sixth embodiment, a pre-fabricated SOI wafer having a trap rich layer is modified by building up a raised region.

In some embodiments, S-contacts are formed in an IC substrate to create protected areas that encompass FETs that are sensitive to accumulated charge effects. More specifically, S-contacts substantially surround each circuit to be protected, essentially creating corresponding "wells" surrounded at least in part by S-contact "rings". The rings of S-contacts reduce substrate impedance and thus settling time of the substrate voltage under the circuits, help in shielding the circuits from electrical interference, help in draining accumulated charge from certain layers of the IC, and help to improve impedance matching for the circuits within the wells by preventing uneven substrate potential between circuits.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention encompasses several types of modifications in selected regions to silicon-on-insulator (SOI) substrates having a trap rich layer, and methods for making such modifications. The modified regions eliminate or manage accumulated charge that would otherwise arise because of the interaction of the underlying trap rich layer and active layer devices undergoing transient changes of state, thereby eliminating or mitigating the effects of such accumulated charge on non-RF integrated circuitry fabricated on such substrates.

In specific applications, use of one or more embodiments of the present invention lowers standby power consumption of FETs while enabling a very quick sleep-to-active transition time (e.g., <1 µS) and achieving a very stable gain very soon after becoming active.

Accordingly, embodiments of the present invention retain the beneficial characteristics of SOI substrates with a trap rich layer for RF circuitry requiring high linearity, such as RF switches, while avoiding the problems of a trap rich layer for circuitry that is sensitive to accumulated charge effects caused by the presence of the trap rich layer, such as non-RF analog circuitry and amplifiers (including power amplifiers and low noise amplifiers).

Modification of Trap Rich Layer During Formation

In a first embodiment, a trap rich layer is selectively formed on a high resistivity substrate.

Figure 1:
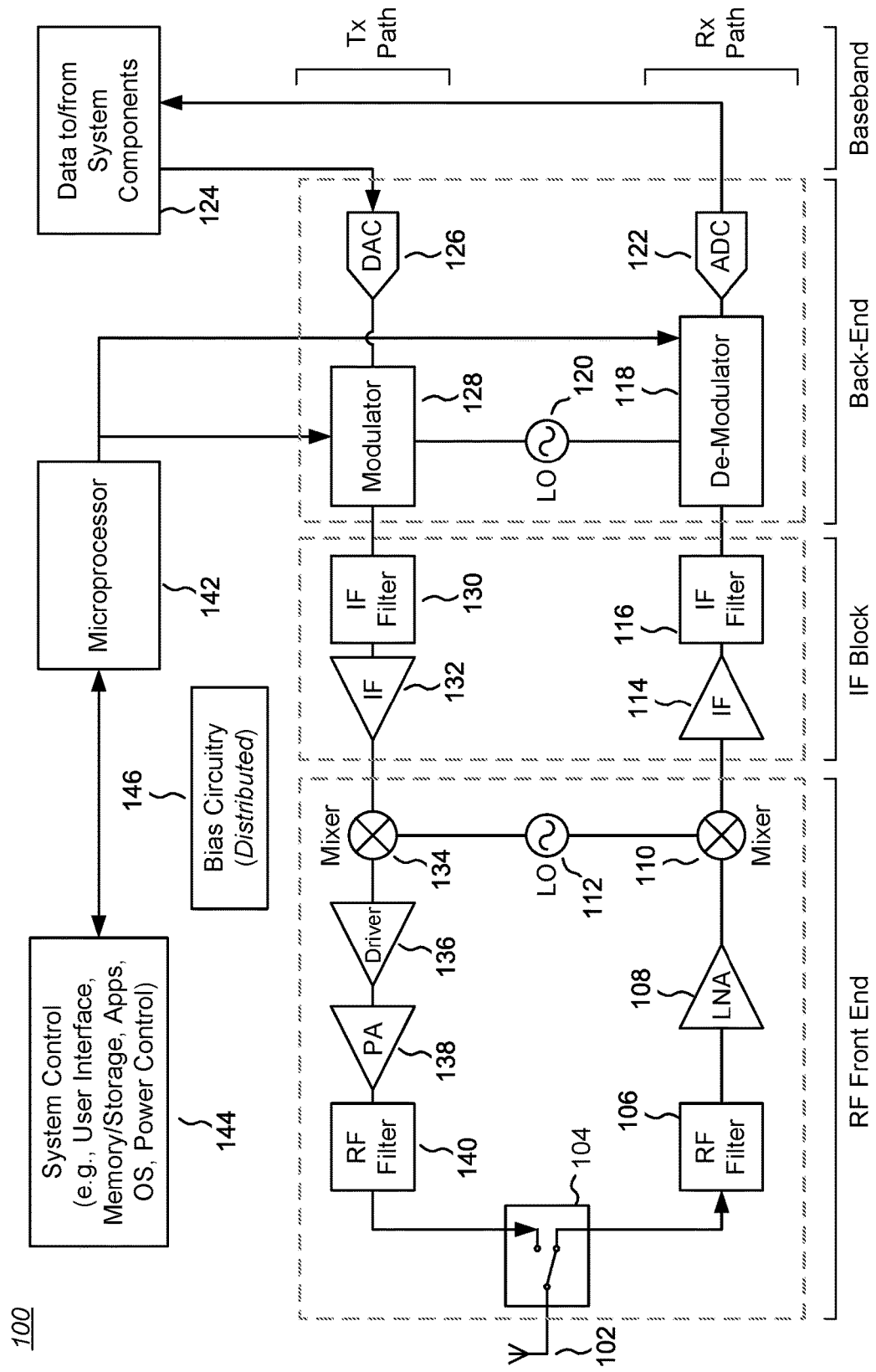
FIG. 1 is a block diagram of a typical prior art transceiver such as the type that might be used in a cellular telephone.
Figure 2:
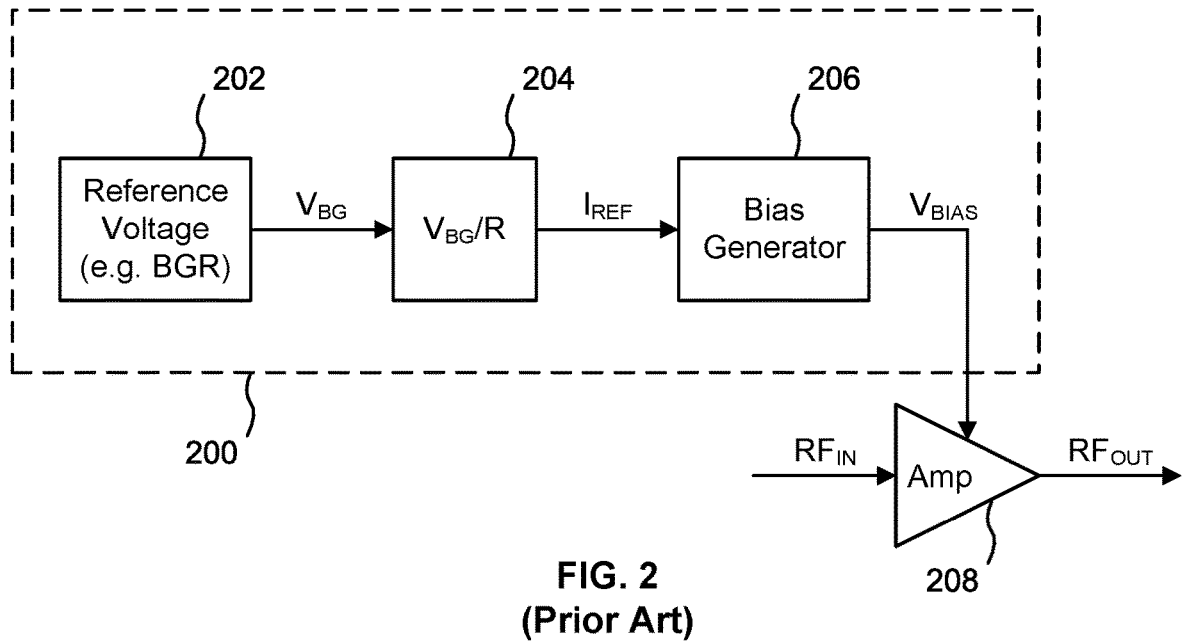
FIG. 2 is a block diagram of a prior art bias voltage generation circuit.
Figure 3:
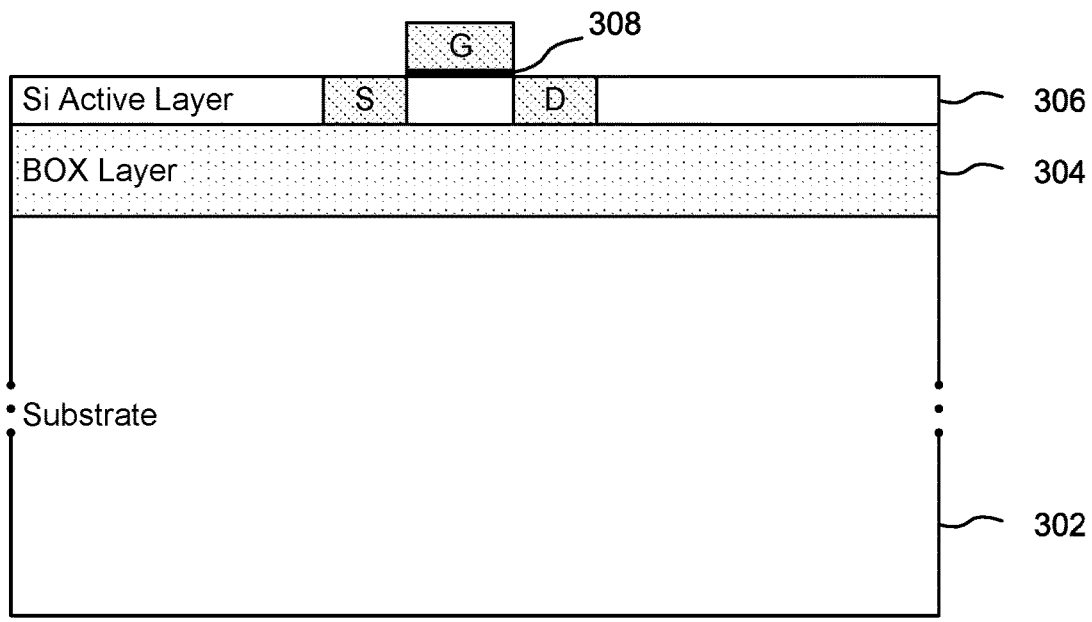
FIG. 3 is block diagram showing a typical prior art SOI IC structure for a single FET.
Figure 4:
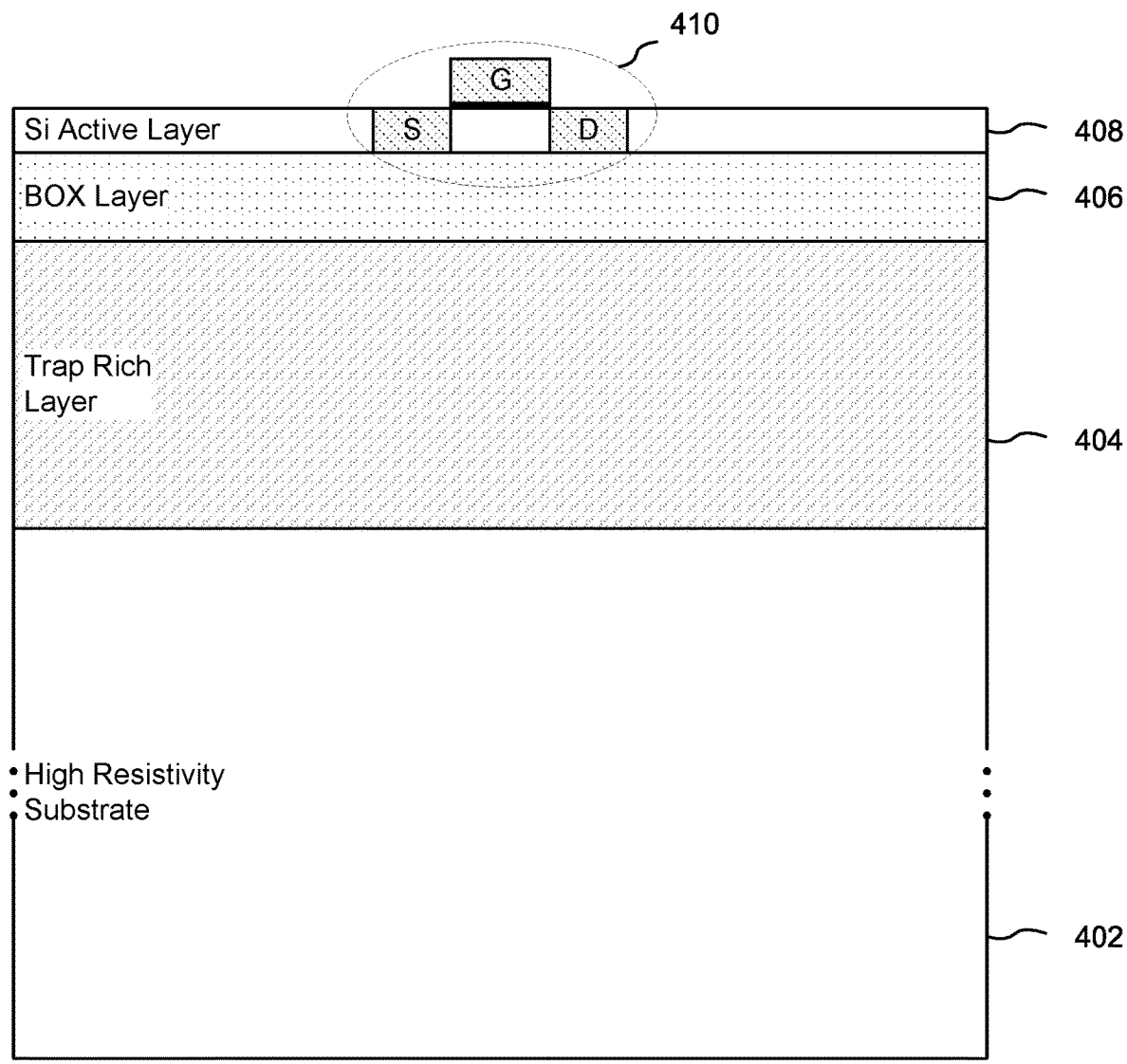
FIG. 4 is block diagram showing an improved prior art SOI IC structure for a single FET.
Figure 5A:
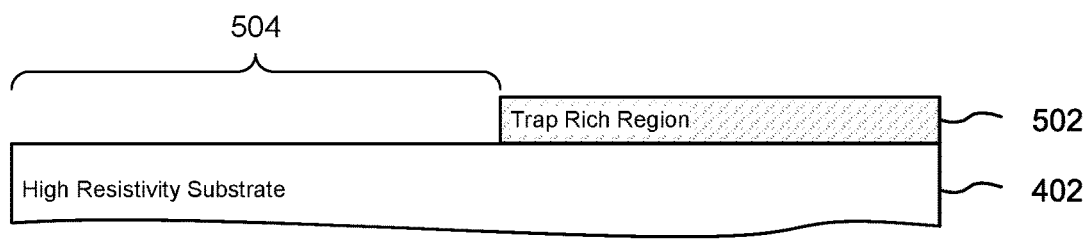
FIG. 5A is a block diagram showing an in-process step in the manufacture of an SOI wafer having a high resistivity substrate.

FIG. 5A is a block diagram showing an in-process step in the manufacture of an SOI wafer 500 having a high resistivity substrate 402. In this example, a mask is used to define a trap rich region 502 on the high resistivity substrate 402 (shown truncated vertically, the actual proportions would more typically resemble FIG. 4). The trap rich region 502 is otherwise formed on the high resistivity substrate 402 in a conventional manner in a pattern defined by the mask.

The stepped area adjacent the trap rich region 502 is a "non-TR region" 504. In some embodiments, a filler material 508, such as BOX, may be deposited within the non-TR region 504 adjacent the trap rich region 502 to provide a flatter surface. As should be apparent, more than one trap rich region 502 and more than one non-TR region 504 can be formed in different areas of an SOI wafer 500. When using a filler material 508, essentially all trap rich regions 502 would be surrounded by non-TR regions 504 (some or all of which may be contiguous).

Figure 5B:
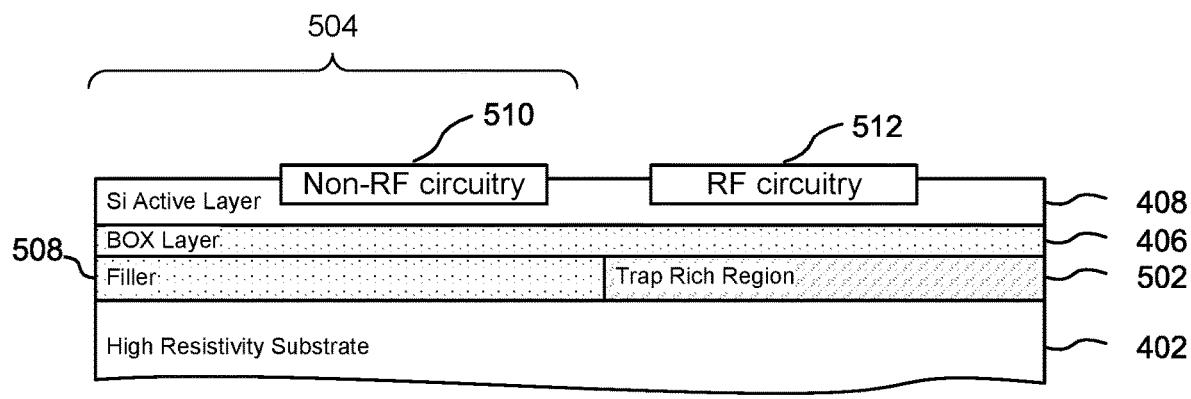
FIG. 5B is a block diagram of an SOI wafer processed in accordance with the teachings of FIG. 5A.

FIG. 5B is a block diagram of an SOI wafer 520 processed in accordance with the teachings of FIG. 5A (the vertical scale has been compressed compared to FIG. 4). A BOX insulator layer 406 has been formed over the trap rich region 502 and the non-TR region 504 (including over the filler material 508, if present) in a conventional manner, and an active layer 408 is then formed over the BOX insulator layer 406 in a conventional manner.

A first variant of the illustrated sequence is to form a trap rich layer on the high resistivity substrate 402, then mask and etch the trap rich layer down to the high resistivity substrate 402 to define non-TR regions 504. In some embodiments, a filler material 508, such as BOX, may be deposited within the non-TR regions 504. Thereafter, a BOX insulator layer 406 and an active layer 408 may be formed, resulting in the structure shown in FIG. 5B (if fillers 508 are used).

A second variant of the illustrated sequence is to form a layer of non-trap rich material (e.g., BOX) on the high resistivity substrate 402, then mask and etch the layer to define regions in which trap rich material is to be formed, then form corresponding trap rich regions 502 within the etched regions. Regions not containing trap rich material would be non-TR regions 504. Thereafter, a BOX insulator layer 406 and an active layer 408 may be formed, resulting in the structure shown in FIG. 5B (if fillers 508 are used).

As illustrated, the non-TR region 504 underlies an area of non-RF circuitry 510 that includes one or more FETs that would be most susceptible to accumulated charge resulting from the interaction of an unmodified trap rich layer 404 and transient changes of state of FETs comprising such circuitry. In contrast, the trap rich region 502 underlies an area of RF circuitry 512 that includes one or more FETs (e.g., FETs in an RF signal path) that generally benefit from the characteristics of the trap rich region 502.

A wide-area non-TR region 504 avoids the problems of aligning FETs with individual "wells" of non-TR regions. As should be apparent, the trap rich region 502 retains all of the normal characteristics of a trap rich layer 404, and thus remains available for fabrication of active layer RF circuitry that can benefit from such characteristics.

Modification of Trap Rich Layer Characteristics Before BOX Layer Formation

In a second embodiment, characteristics of a trap rich layer are modified before formation of a BOX insulator layer.

Figure 6A:
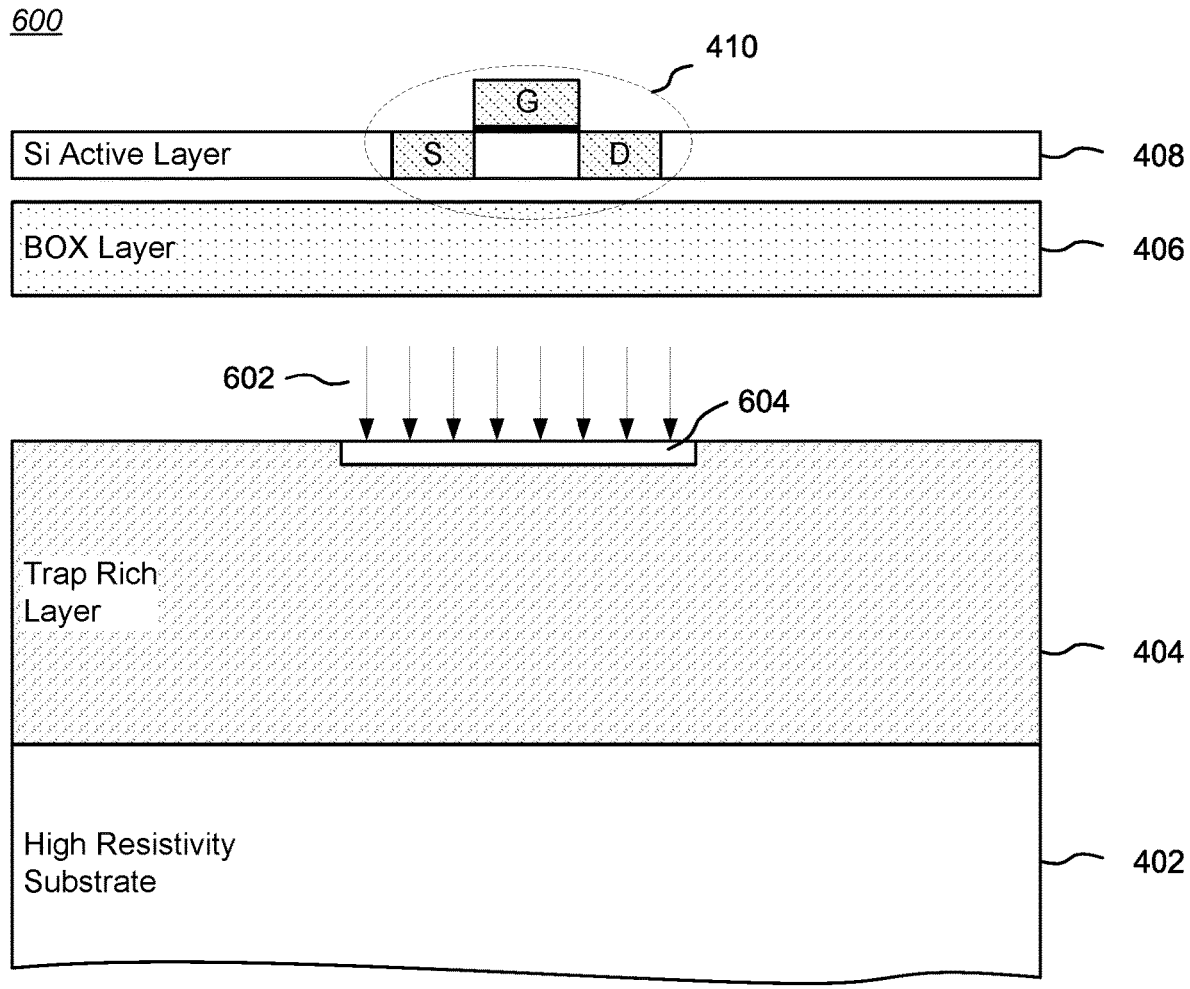
FIG. 6A is a block diagram showing an in-process step in the manufacture of an SOI wafer having a high resistivity substrate and a trap rich layer.

FIG. 6A is a block diagram showing an in-process step in the manufacture of an SOI wafer 600 having a high resistivity substrate 402 and a trap rich layer 404. In this example, the trap rich layer 404 has already been formed on the high resistivity substrate 402 (shown truncated vertically, the actual proportions would more typically resemble FIG. 4).

Before forming a BOX insulator layer 406 over the trap rich layer 404, a modification is made to regions of the trap rich layer 404 that would underlie one or more FETs that otherwise would be adversely affected by accumulated charge resulting from the interaction of the trap rich layer 404 and active layer devices undergoing transient changes of state. More specifically, a surface modification step 602 is applied to implant or diffuse a selected dopant into the material of selected areas of the trap rich layer 404 so as to damage a region 604 of the trap rich layer 404 sufficiently that its ability to trap such accumulated charge is eliminated or mitigated. More specifically, the damaged region 604 is made more conductive than the trap rich layer 404, allowing accumulated charge to more rapidly dissipate.

The modification step 602 may be carried out in a conventional manner, such as by ion implantation or diffusion through a mask defining the areal extent for the damaged region 604. The selected dopant may be an N-type or P-type dopant, such as phosphorus, arsenic (N-type) or boron (P-type).

After the modification step 602, a BOX insulator layer 406 is formed over the trap rich layer 404 in a conventional manner, and an active layer 408 is then formed over the BOX insulator layer 406 in a conventional manner. One or more FETs 410 are then formed within and/or on the active layer 408 over the damaged region 604. The effects of accumulated charge on such FETs 410 that would otherwise result from the interaction of the trap rich layer 404 and transient changes of state of the FETs 410 are eliminated or mitigated by the underlying damaged region 604.

While only a single FET 410 is shown in FIG. 6A, normally the damaged region 604 of the trap rich layer 404 will extend over an area underlying a plurality of FETs 410, such as FET-based analog circuitry not in the RF signal path. A wide-area damaged region 604 thus avoids the problems of aligning FETs with individual "wells" of damaged trap rich layer 404. As should be apparent, areas of the trap rich layer 404 outside of the damaged region 604 retain all of the normal characteristics of the trap rich layer 404, and thus remain available for fabrication of active layer RF circuitry that can benefit from such characteristics.

Figure 6B:
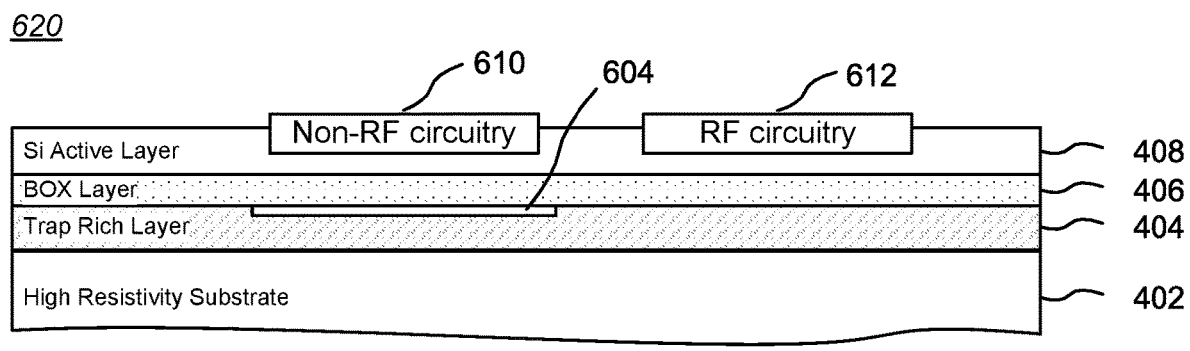
FIG. 6B is a block diagram of an SOI wafer processed in accordance with the teachings of FIG. 6A.

For example, FIG. 6B is a block diagram of an SOI wafer 620 processed in accordance with the teachings of FIG. 6A (the vertical scale has been compressed). A damaged region 604 within the trap rich layer 404 underlies an area of non-RF circuitry 610 that includes one or more FETs that would be most susceptible to accumulated charge resulting from the interaction of an unmodified trap rich layer 404 and transient changes of state of FETs comprising such circuitry.

In contrast, the trap rich layer 404 remains undamaged underneath an area of RF circuitry 612 that includes one or more FETs (e.g., FETs in an RF signal path).

The amount of doping applied to the damaged region 604 within the trap rich layer 404 may be determined by modeling or empirically, taking into account such factors as the thickness of the BOX insulator layer 406, and the power and switching characteristics of and specifications for the non-RF circuitry 610.

Modification of Trap Rich Layer Characteristics After BOX Layer Formation

In a third embodiment, characteristics of a trap rich layer are modified after formation of a BOX insulator layer (and optionally after formation of an active layer).

Figure 7A:
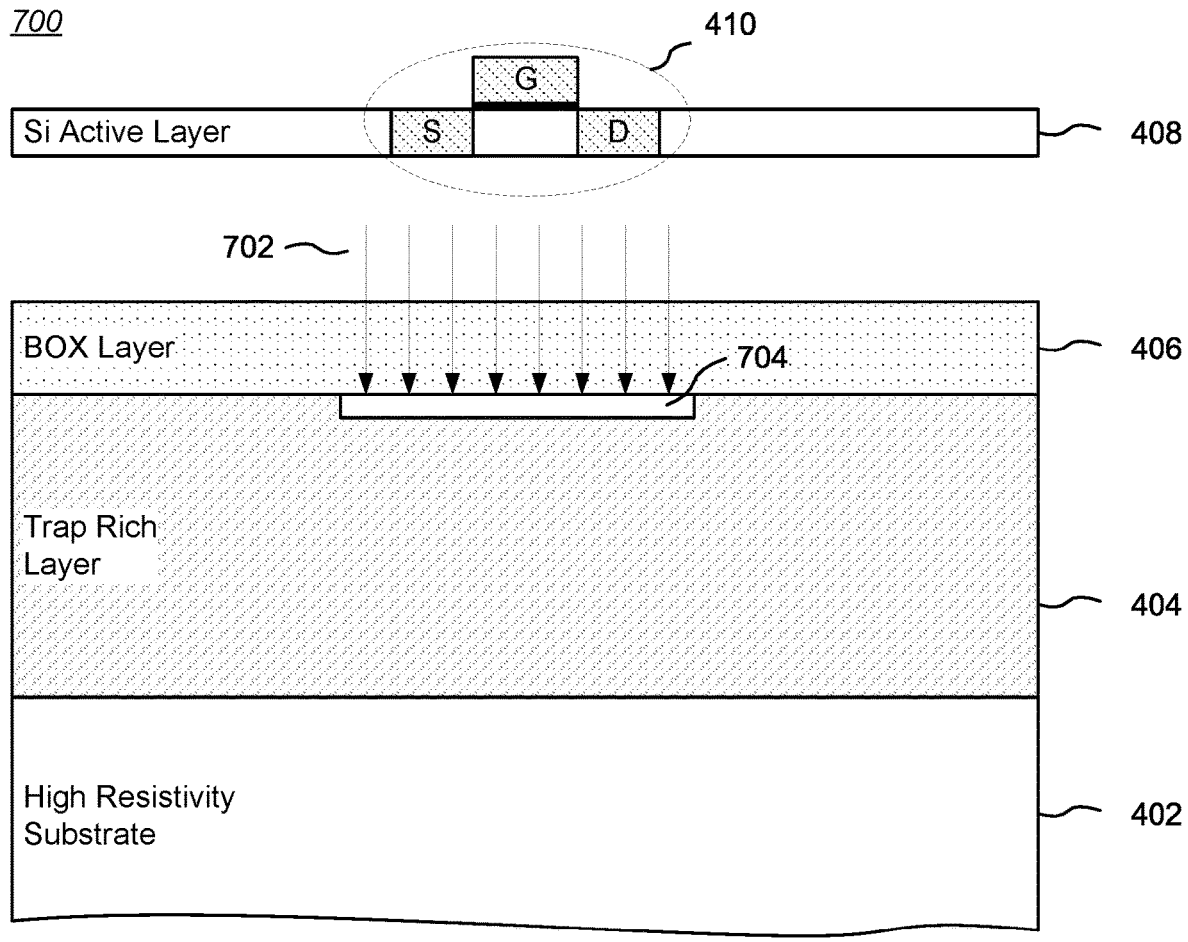
FIG. 7A is a block diagram showing an in-process step in the manufacture of an SOI wafer having a high resistivity substrate, a trap rich layer, and a BOX insulator layer.

FIG. 7A is a block diagram showing an in-process step in the manufacture of an SOI wafer 700 having a high resistivity substrate 402, a trap rich layer 404, and a BOX insulator layer 406. In this example, the trap rich layer 404 and the BOX insulator layer 406 have already been formed on the high resistivity substrate 402 (again, shown truncated vertically, the actual proportions would more typically resemble FIG. 4).

After forming the BOX insulator layer 406 over the trap rich layer 404, a modification is made to regions of the trap rich layer 404 that would underlie one or more FETs that otherwise would be adversely affected by accumulated charge resulting from the interaction of the trap rich layer 404 and active layer devices undergoing transient changes of state. More specifically, a surface modification step 702 is applied to implant a selected dopant through the BOX insulator layer 406 and into the material of selected areas of the trap rich layer 404 so as to damage a region 704 of the trap rich layer 404 sufficiently that its ability to trap such accumulated charge is eliminated or mitigated. More specifically, the damaged region 704 is made more conductive than the trap rich layer 404, allowing accumulated charge to more rapidly dissipate.

The modification step 702 may be carried out in a conventional manner, such as by ion implantation through a mask defining the areal extent for the damaged region 704. The selected dopant may be an N-type or P-type dopant, such as phosphorus, arsenic (N-type) or boron (P-type).

After the modification step 702, an active layer 408 is formed over the BOX insulator layer 406 in a conventional manner. One or more FETs 410 are then formed within and/or on the active layer 408 over the damaged region 704. The effects of accumulated charge on such FETs 410 that would otherwise result from the interaction of the trap rich layer 404 and transient changes of state of the FETs 410 are eliminated or mitigated by the underlying damaged region 704.

While only a single FET 410 is shown in FIG. 7A, normally the damaged region 704 of the trap rich layer 404 will extend over an area underlying a plurality of FETs 410, such as FET-based analog circuitry not in the RF signal path. A wide-area damaged region 704 thus avoids the problems of aligning FETs with individual "wells" of damaged trap rich layer 404. As should be apparent, areas of the trap rich layer 404 outside of the damaged region 704 retain all of the normal characteristics of the trap rich layer 404, and thus remain available for fabrication of active layer RF circuitry that can benefit from such characteristics.

Figure 7B:
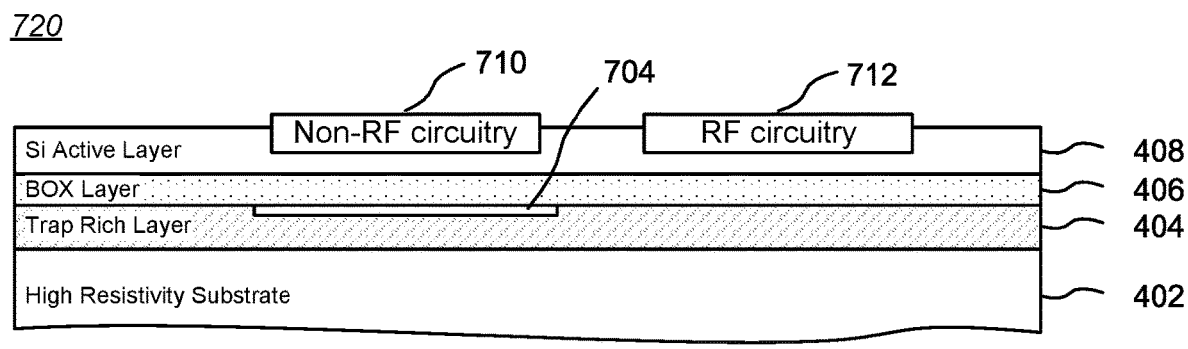
FIG. 7B is a block diagram of an SOI wafer processed in accordance with the teachings of FIG. 7A.

For example, FIG. 7B is a block diagram of an SOI wafer 720 processed in accordance with the teachings of FIG. 7A (the vertical scale has been compressed). A damaged region 704 within the trap rich layer 404 underlies an area of non-RF circuitry 710 that includes one or more FETs that would be most susceptible to accumulated charge resulting from the interaction of an unmodified trap rich layer 404 and transient changes of state of FETs comprising such circuitry. In contrast, the trap rich layer 404 remains undamaged underneath an area of RF circuitry 712 that includes one or more FETs (e.g., FETs in an RF signal path).

Figure 7C:
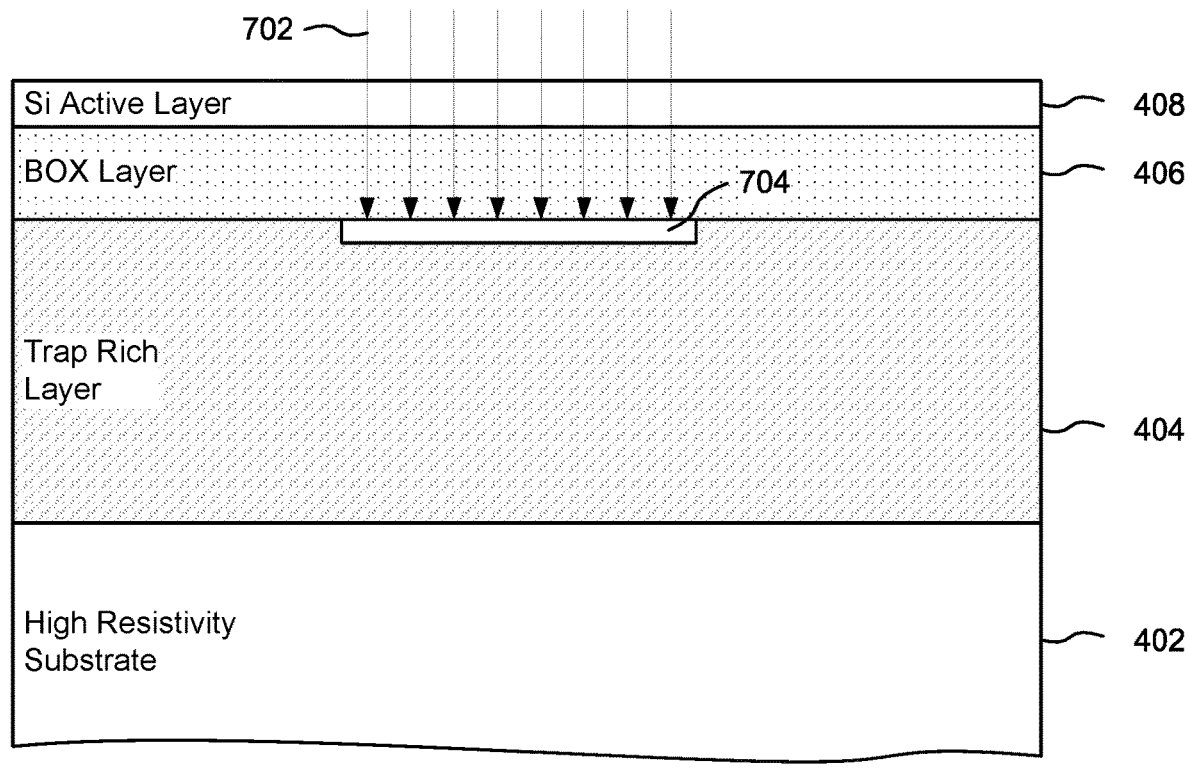
FIG. 7C is a block diagram showing a variant in-process step in the manufacture of an SOI wafer having a high resistivity substrate, a trap rich layer, a BOX insulator layer, and an active layer.

FIG. 7C is a block diagram showing a variant in-process step in the manufacture of an SOI wafer 740 having a high resistivity substrate 402, a trap rich layer 404, a BOX insulator layer 406, and an active layer 408. In this example, the trap rich layer 404, the BOX insulator layer 406, and the active layer 408 have already been formed on the high resistivity substrate 402 (again, shown truncated vertically, the actual proportions would more typically resemble FIG. 4).

Again, a modification is made to regions of the trap rich layer 404 that would underlie one or more FETs that otherwise would be adversely affected by accumulated charge resulting from the interaction of the trap rich layer 404 and active layer devices undergoing transient changes of state. More specifically, a surface modification step 702 is applied to implant a selected dopant through the active layer 408 and the BOX insulator layer 406 into the material of selected areas of the trap rich layer 404 so as to damage a region 704 of the trap rich layer 404 sufficiently that its ability to trap such accumulated charge is eliminated or mitigated. More specifically, the damaged region 704 is made more conductive than the trap rich layer 404, allowing accumulated charge to more rapidly dissipate. Processing may continue as shown in FIG. 7B, with formation of non-RF circuitry 710 over the damaged region 704 and formation of RF circuitry 712 over the trap rich layer 404.

As in the embodiment shown by way of example in FIGS. 5A and 5B, the amount of doping applied to the damaged region 704 within the trap rich layer 404 may be determined by modeling or empirically, taking into account such factors as the thickness of the BOX insulator layer 406, and the power and switching characteristics of and specifications for the non-RF circuitry 710.

Laser Modification of Trap Rich Layer Characteristics after BOX Layer Formation

In a fourth embodiment, characteristics of a trap rich layer are modified after formation of a BOX insulator layer (and optionally after formation of an active layer) by using a laser annealing process.

Figure 8A:
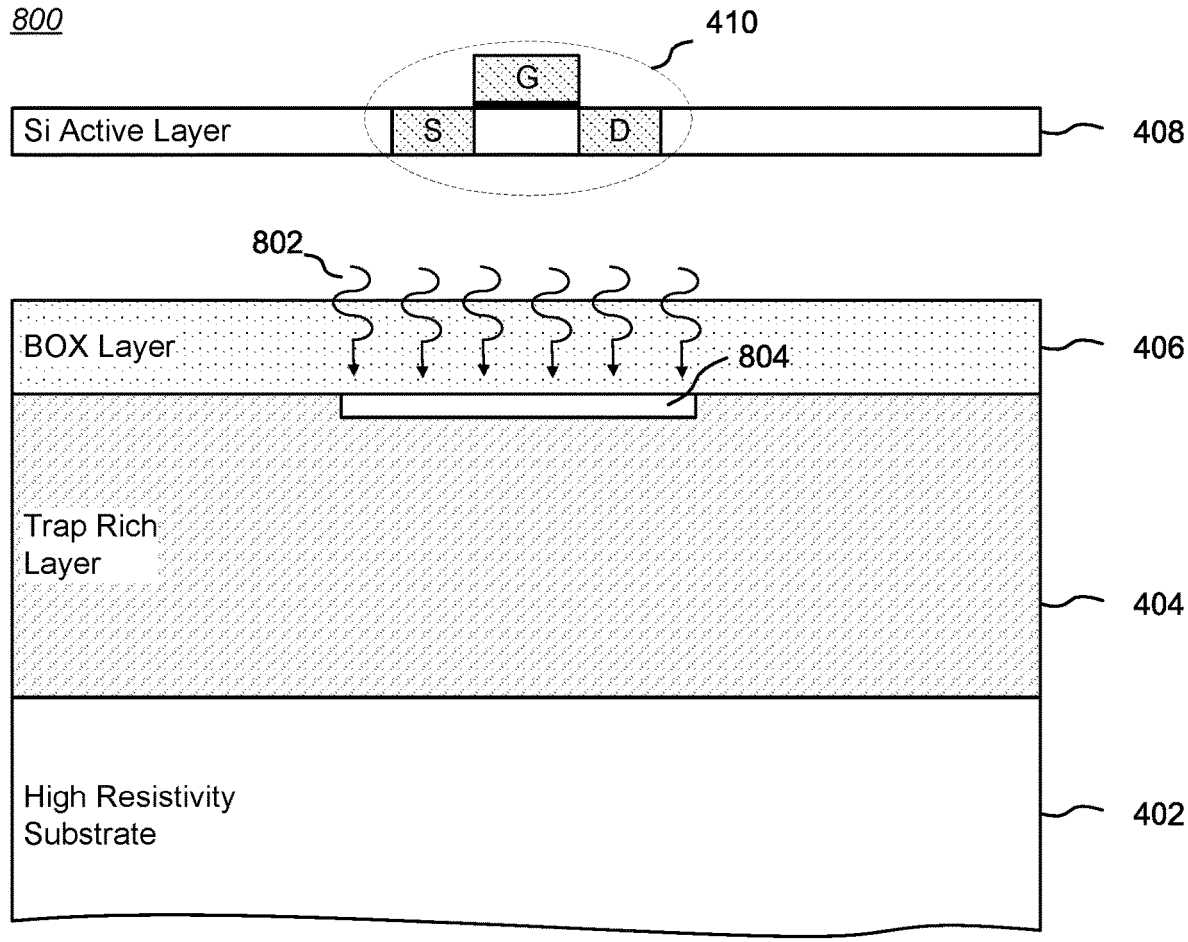
FIG. 8A is a block diagram showing an in-process step in the manufacture of an SOI wafer having a high resistivity substrate, a trap rich layer, and a BOX insulator layer.

FIG. 8A is a block diagram showing an in-process step in the manufacture of an SOI wafer 800 having a high resistivity substrate 402, a trap rich layer 404, and a BOX insulator layer 406. In this example, the trap rich layer 404 and the BOX insulator layer 406 have already been formed on the high resistivity substrate 402 (again, shown truncated vertically, the actual proportions would more typically resemble FIG. 4). Of note, the BOX insulator layer 406 is essentially transparent to a range of light wavelengths, including infrared.

After forming the BOX insulator layer 406 over the trap rich layer 404, a modification is made to regions of the trap rich layer 404 that would underlie one or more FETs that otherwise would be adversely affected by accumulated charge resulting from the interaction of the trap rich layer 404 and active layer devices undergoing transient changes of state. More specifically, light energy 802 from a focused laser (not shown) is used to anneal the material of selected areas of the trap rich layer 404 so as to change the electrical characteristics of an annealed region 804 of the trap rich layer 404 sufficiently that its ability to trap such accumulated charge is eliminated or mitigated.

In greater detail, a laser is selected having a wavelength that will transmit through the BOX insulator layer 406. Light energy 802 from the laser is focused through the BOX insulator layer 406 onto the trap rich layer 404 to locally melt the trap rich layer 404. As noted above, the trap rich layer 404 is typically formed as a layer of amorphous or polycrystalline silicon on the high resistivity substrate 402, and significantly degrades the mobility of the charge carriers in the thin surface region of the high resistivity substrate 402. However, the amorphous or polycrystalline silicon is not very conductive to current flow. Laser annealing melts the amorphous or polycrystalline silicon and allows recrystallization into larger crystals (or even into a single crystal) that have a higher conductivity to current flow. Accordingly, the annealed region 804 of the trap rich layer 404 is more conductive than the unmodified trap rich layer 404, thus allowing accumulated charge to more rapidly dissipate. Accordingly, the process is similar in a number of ways to the process shown in FIGS. 7A and 7B.

After the laser annealing modification step, an active layer 408 is formed over the BOX insulator layer 406 in a conventional manner. One or more FETs 410 are then formed within and/or on the active layer 408 over the annealed region 804. The effects of accumulated charge on such FETs 410 that would otherwise result from the interaction of the trap rich layer 404 and transient changes of state of the FETs 410 are eliminated or mitigated by the underlying annealed region 804.

While only a single FET 410 is shown in FIG. 8A, normally the annealed region 804 of the trap rich layer 404 will extend over an area underlying a plurality of FETs 410, such as FET-based analog circuitry not in the RF signal path. A wide-area annealed region 804 thus avoids the problems of aligning FETs with individual "wells" of annealed trap rich layer 404. As should be apparent, areas of the trap rich layer 404 outside of the annealed region 804 retain all of the normal characteristics of the trap rich layer 404, and thus remain available for fabrication of active layer RF circuitry that can benefit from such characteristics.

Figure 8B:
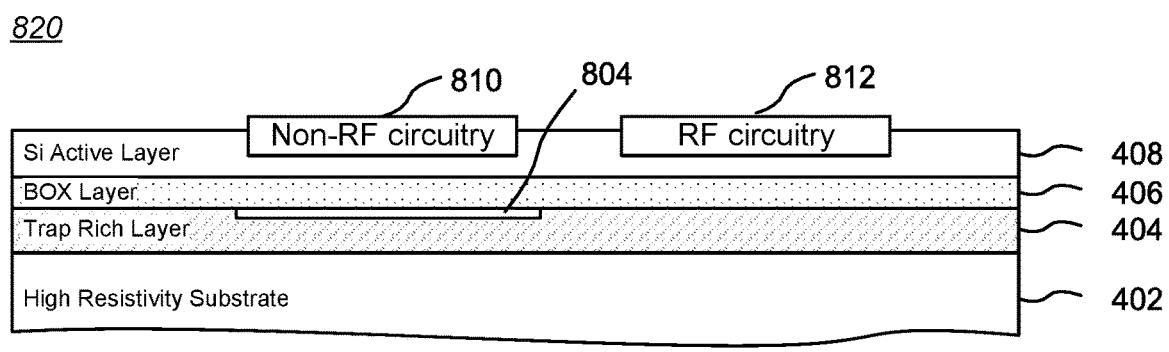
FIG. 8B is a block diagram of an SOI wafer processed in accordance with the teachings of FIG. 8A.

For example, FIG. 8B is a block diagram of an SOI wafer 820 processed in accordance with the teachings of FIG. 8A (the vertical scale has been compressed). An annealed region 804 within the trap rich layer 404 underlies an area of non-RF circuitry 810 that includes one or more FETs that would be most susceptible to accumulated charge resulting from the interaction of an unmodified trap rich layer 404 and transient changes of state of FETs comprising such circuitry. In contrast, the trap rich layer 404 remains unchanged underneath an area of RF circuitry 812 that includes one or more FETs (e.g., FETs in an RF signal path).

Figure 8C:
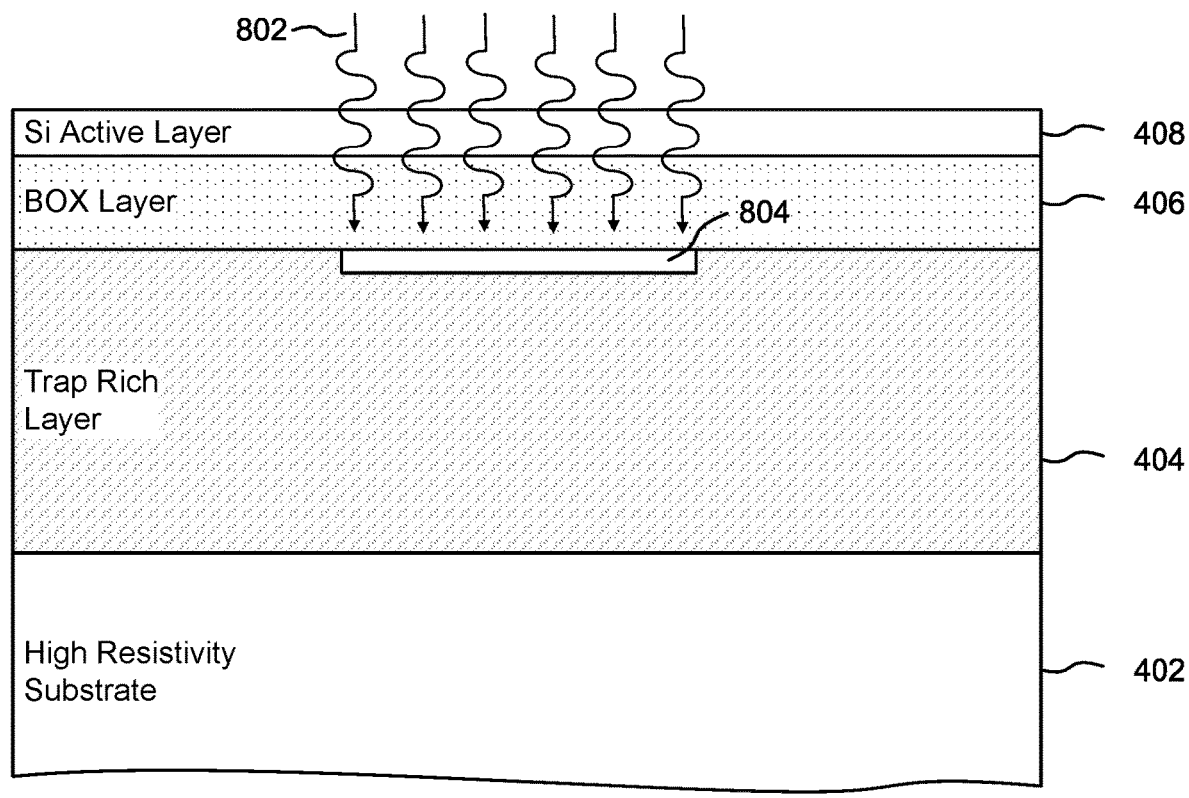
FIG. 8C is a block diagram showing a variant in-process step in the manufacture of an SOI wafer having a high resistivity substrate, a trap rich layer, a BOX insulator layer, and an active layer.

FIG. 8C is a block diagram showing a variant in-process step in the manufacture of an SOI wafer 840 having a high resistivity substrate 402, a trap rich layer 404, a BOX insulator layer 406, and an active layer 408. In this example, the trap rich layer 404, the BOX insulator layer 406, and the active layer 408 have already been formed on the high resistivity substrate 402 (again, shown truncated vertically, the actual proportions would more typically resemble FIG. 4). As with FIG. 8A, the BOX insulator layer 406 is essentially transparent to a range of light wavelengths, including infrared.

A modification is made to regions of the trap rich layer 404 that would underlie one or more FETs that otherwise would be adversely affected by accumulated charge resulting from the interaction of the trap rich layer 404 and active layer devices undergoing transient changes of state. More specifically, light energy 802 from a focused laser (not shown) is used to anneal the material of selected areas of the trap rich layer 404 so as to change the electrical characteristics of an annealed region 804 of the trap rich layer 404 sufficiently that its ability to trap such accumulated charge is eliminated or mitigated. As described with respect to FIG. 8A, the laser is selected to have a wavelength that will transmit through the BOX insulator layer 406. Light energy 802 from the laser is focused through the active layer 408 and the BOX insulator layer 406 onto the trap rich layer 404 to locally melt the trap rich layer 404 to form the annealed region 804. The active layer 408 is very thin and will absorb little energy from the laser beam. As with the embodiment of FIG. 8A, the annealed region 804 of the trap rich layer 404 is more conductive than the unmodified trap rich layer 404, thus allowing accumulated charge to more rapidly dissipate. Processing may continue as shown in FIG. 8B, with formation of non-RF circuitry 810 over the annealed region 804 and formation of RF circuitry 812 over the trap rich layer 404. In some embodiments, laser annealing may be performed after formation of non-RF circuitry 810 over a region, thereby converting that region to an annealed region 804.

Modification of Trap Rich Layer After Wafer Fabrication

In a fifth embodiment, a trap rich layer of a pre-fabricated SOI wafer is modified by removal of selected regions of the trap rich layer.

Figure 9A:
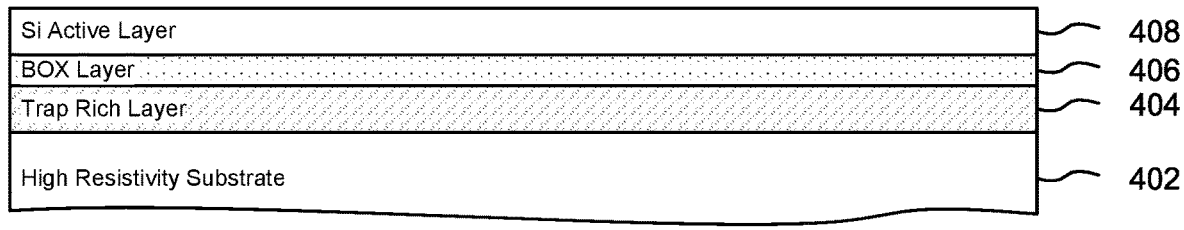
FIG. 9A is a block diagram of a fabricated SOI wafer.

FIG. 9A is a block diagram of a fabricated SOI wafer 900. As illustrated, the SOI wafer 900 includes a silicon high resistivity substrate 402, a trap rich layer 404, a BOX insulator layer 406, and an active layer 408. As noted above, pre-fabricated SOI wafers having the illustrated configuration are commercially available.

Figure 9B:
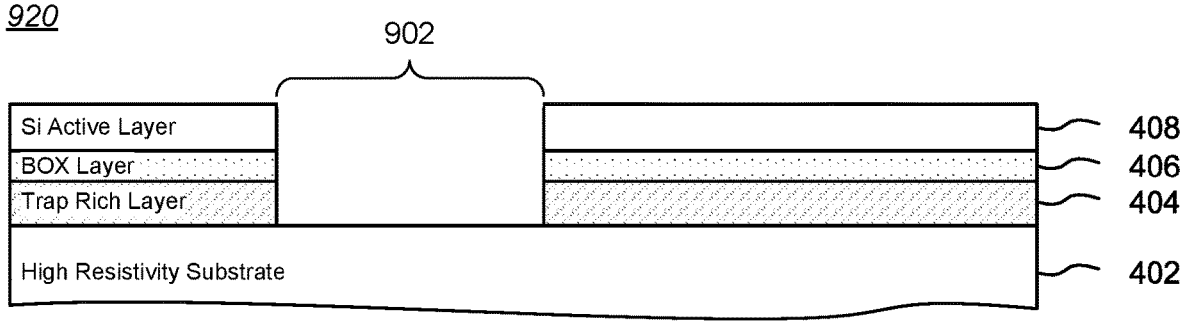
FIG. 9B is a block diagram of an etched fabricated SOI wafer.

FIG. 9B is a block diagram of an etched fabricated SOI wafer 920. In this example, a mask has been applied and the SOI wafer 920 has been etched in a conventional manner to create a void 902 down through the BOX insulator layer 406 and the trap rich layer 404 to the high resistivity substrate 402.

Figure 9C:
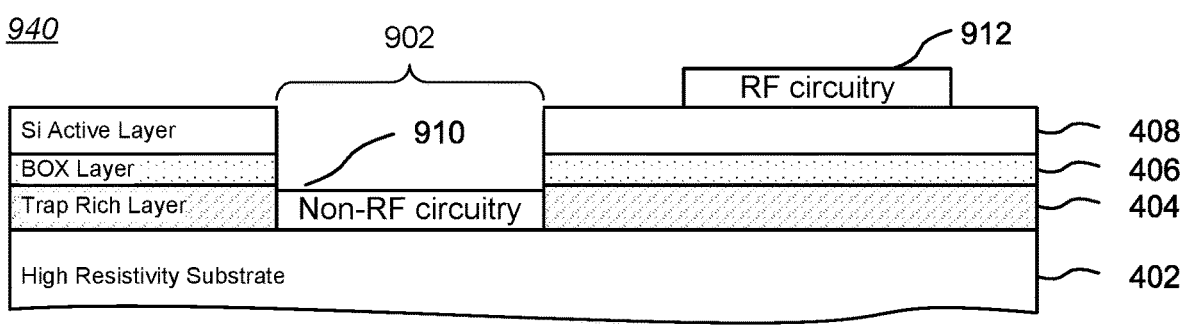
FIG. 9C is a block diagram of an etched SOI wafer processed in accordance with the teachings of FIG. 9B.

FIG. 9C is a block diagram of an etched SOI wafer 940 processed in accordance with the teachings of FIG. 9B. Non-RF circuitry 910 may be formed in a conventional manner directly on the high resistivity substrate 402, rather than over the trap rich layer 404. The non-RF circuitry 910 may generally include one or more FETs that would be most susceptible to accumulated charge resulting from the interaction of an unmodified trap rich layer 404 and transient changes of state of FETs comprising such circuitry. As illustrated, an area of RF circuitry 912 that includes one or more FETs that generally benefit from the characteristics of a trap rich layer (e.g., FETs in an RF signal path) may be formed over the remaining trap rich layer 404.

Figure 9D:
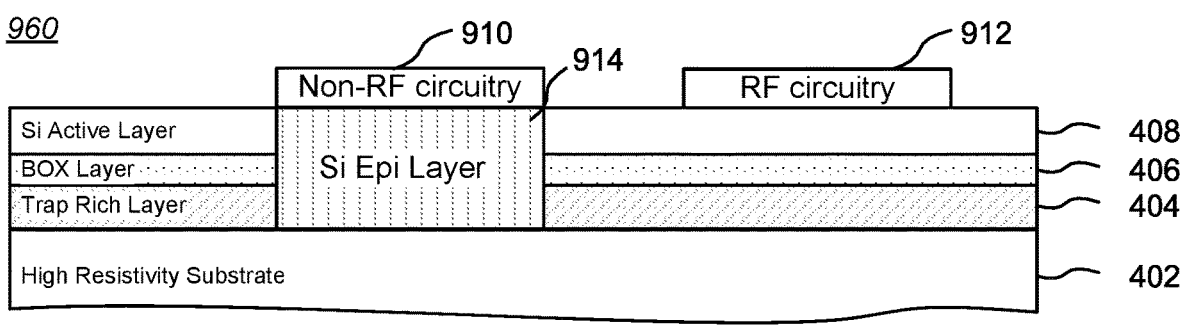
FIG. 9D is a block diagram of a variant of an etched SOI wafer processed in accordance with the teachings of FIG. 9B.

FIG. 9D is a block diagram of a variant of an etched SOI wafer 960 processed in accordance with the teachings of FIG. 9B. A silicon epitaxial layer 914 is be formed over the bare high resistivity substrate 402 of FIG. 9B using conventional masking and epitaxial growth techniques. In the illustrated example, the epitaxial layer 914 is shown as completely filling the void 902 of FIG. 9B. However, the epitaxial layer 914 may be grown to a level that does not completely fill the void 902, or which over-fills the void 902. Non-RF circuitry 910 may then be formed on the epitaxial layer 914 in a conventional manner.

Modification of Trap Rich Wafer After Wafer Fabrication

In a sixth embodiment, a pre-fabricated SOI wafer having a trap rich layer is modified by building up a raised region.

Figure 10A:
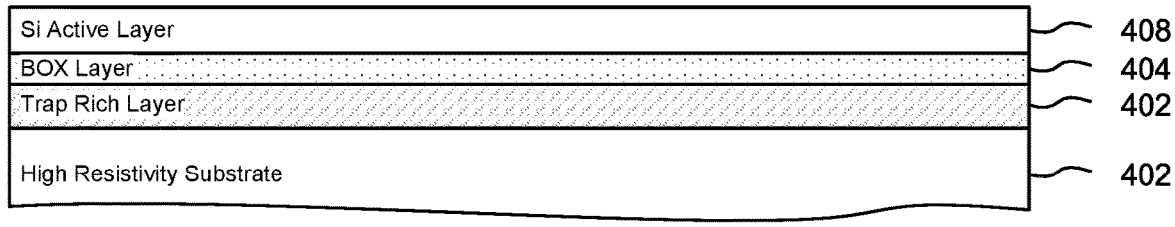
FIG. 10A is a block diagram of a fabricated SOI wafer.

FIG. 10A is a block diagram of a fabricated SOI wafer 1000. As illustrated, the SOI wafer 1000 includes a silicon high resistivity substrate 402, a trap rich layer 404, a BOX insulator layer 406, and an active layer 408. As noted above, pre-fabricated SOI wafers having the illustrated configuration are commercially available.

Figure 10B:
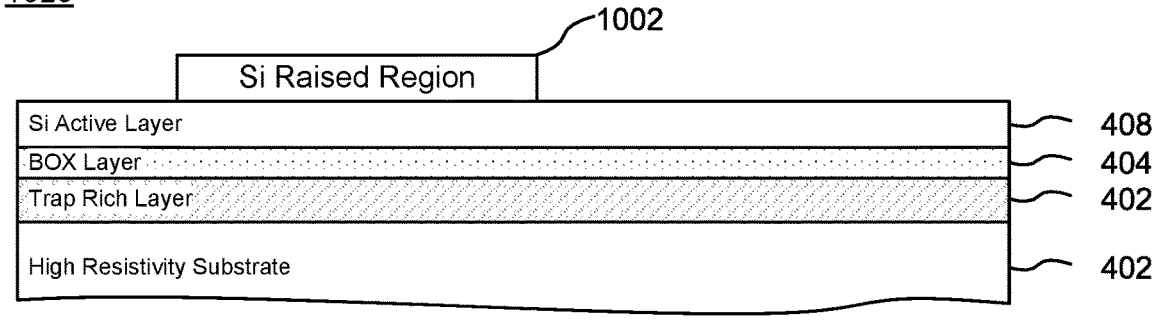
FIG. 10B is a block diagram of an augmented SOI wafer.

FIG. 10B is a block diagram of an augmented SOI wafer 1020. In this example, a mask has been applied and a raised region 1002 of silicon has been formed in a conventional manner to create a raised region above the active layer 408.

Figure 10C:
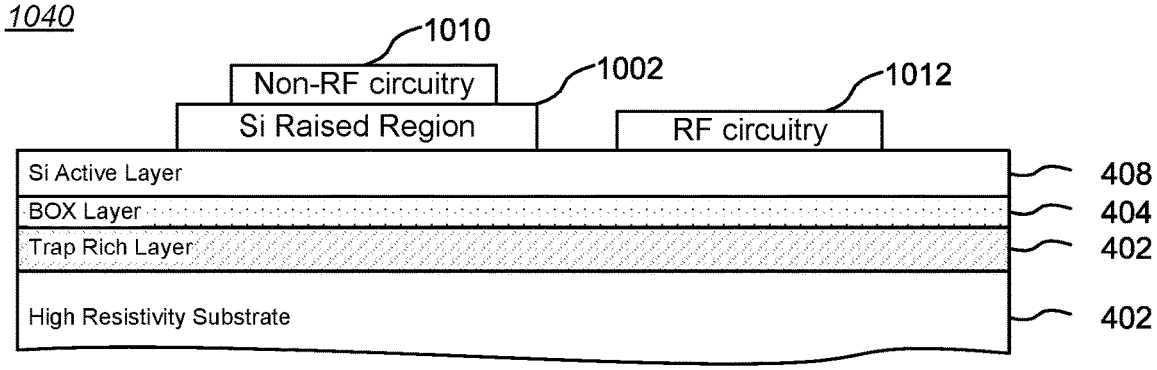
FIG. 10C is a block diagram of an augmented SOI wafer processed in accordance with the teachings of FIG. 10B.

FIG. 10C is a block diagram of an augmented SOI wafer 1040 processed in accordance with the teachings of FIG. 10B. Non-RF circuitry 1010 may be formed in a conventional manner on the raised region 1002, spaced further from the trap rich layer 404 than if formed directly on the active layer 408. The increased spacing will make the raised region 1002 behave more like a bulk substrate with respect to FETs fabricated on the raised region 1002, thereby reducing the formation and influence of accumulated charge near the trap rich layer 404.

The non-RF circuitry 1010 may generally include one or more FETs that would be most susceptible to accumulated charge resulting from the interaction of an unmodified trap rich layer 404 and transient changes of state of FETs comprising such circuitry. As illustrated, an area of RF circuitry 1012 that includes one or more FETs that generally benefit from the characteristics of a trap rich layer (e.g., FETs in an RF signal path) may be formed over the trap rich layer 404 elsewhere on the SOI wafer 1040.

Substrate Stabilization

Additional techniques may optionally be used in conjunction with embodiments described above. For example, in some embodiments, it may be useful to create protected areas on an SOI substrate that encompass FETs that are sensitive to accumulated charge effects by surrounding such areas with substrate contacts (S-contacts), such as the type of S-contacts taught in U.S. patent application Ser. No. 14/964,412 referenced above.

An S-contact in the context of an IC structure is a path which provides a resistive conduction path between a contact region at a surface of a layer of the IC structure and a contact region at or near a surface of a high resistivity substrate of the IC structure (high resistivity includes a range of 3,000 to 20,000 or higher ohm-cm; as known to a person skilled in the art, standard SOI process uses substrates with a low resistivity, typically below 1,000 ohm-cm).

Figure 11:
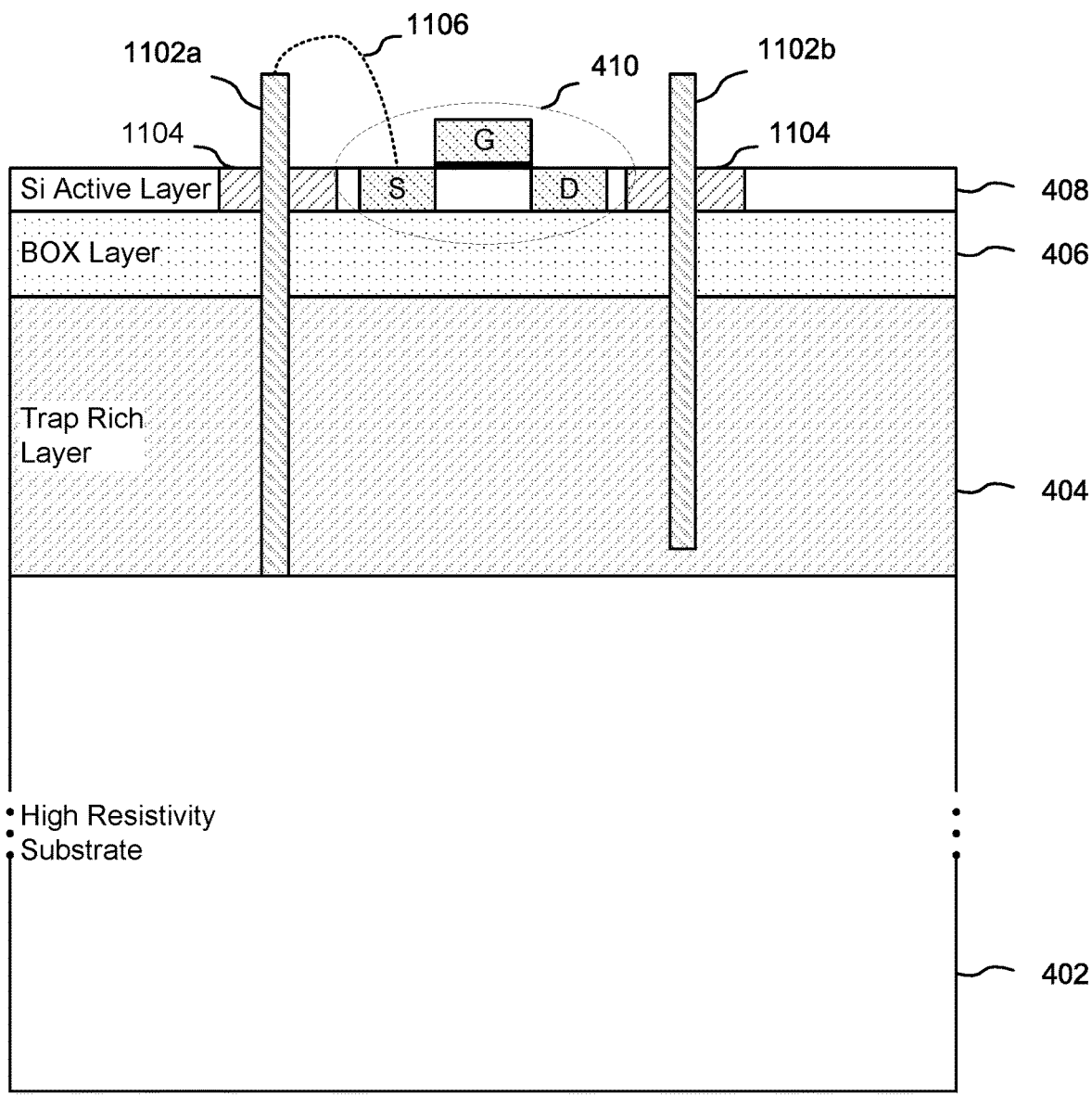
FIG. 11 is block diagram showing an SOI IC structure with a trap rich layer and substrate contacts for a single FET.

For example, FIG. 11 is block diagram showing an SOI IC structure 1100 with a trap rich layer 404, a BOX insulator layer 406, and substrate contacts for a single FET 410. In the illustrated embodiment, which is otherwise similar to FIG. 4, two S-contacts 1102a, 1102b penetrate through corresponding isolation regions 1104 from the active layer 408 to or near the upper surface of the high resistivity substrate 402. The material used for the S-contacts 1102a, 1102b can be any low resistivity conductive material, such as polysilicon and various metals (e.g., tungsten, copper, etc.). In the case of an SOI device, the isolation regions 1104 can be shallow trench isolation (STI) regions. By virtue of penetrating through the isolation regions 1104 within the active layer 408, the S-contacts remain isolated from direct contact with other active regions of the active layer 408. In common practice, the S-contacts 1102a, 1102b are electrically connected, directly or through other circuit elements, to the source S or the gate G of a FET 410; one possible electrical connection is shown by a dotted line 1106 from the source S of the FET 410 to one S-contact 1102a (other possible contacts are not shown here, but are illustrated in U.S. patent application Ser. No. 14/964,412 referenced above). However, as discussed below, the S-contacts 1102a, 1102b may electrically connected to circuit ground or to another known potential.

In the case of SOI substrates having a trap rich layer 404, as shown in FIG. 11, an S-contact 1102a can penetrate through the trap rich layer 404 to make direct contact with the high resistivity substrate 402. Alternatively, since the trap rich layer 404 has some conductivity (and may be as conductive as the high resistivity substrate 402), in some applications an S-contact 1102b can make a resistive contact with the high resistivity substrate 402 by contacting the surface of the trap rich layer 404. In other applications, an S-contact 1102b can penetrate the trap rich layer 404 to a depth sufficient enough to make a resistive contact, through a remaining portion of the thickness of the trap rich layer 404, with the high resistivity substrate 402.

Figure 12:
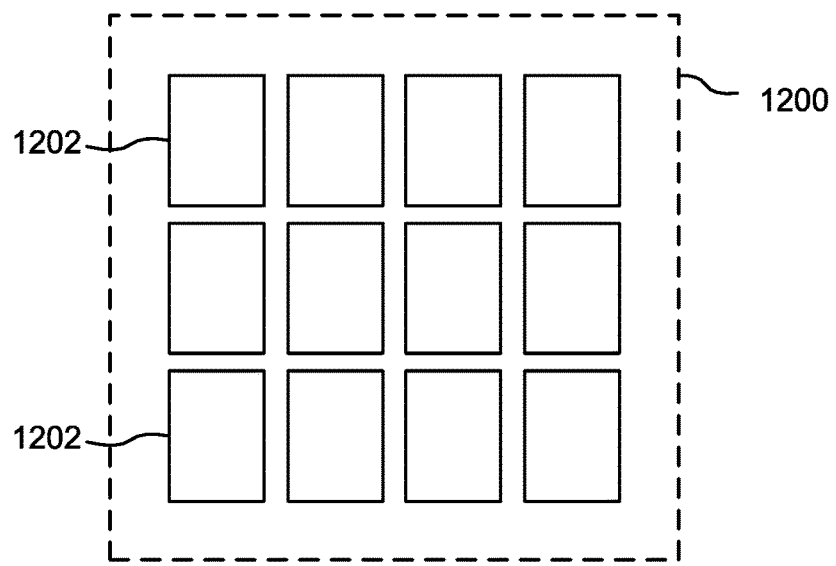
FIG. 12 is a top plan view of an area of a stylized IC that includes twelve example circuits of a type susceptible to accumulated charge resulting from the interaction of an unmodified trap rich layer and transient changes of state of FETs comprising such circuitry (e.g., current mirrors for bias circuits of a power amplifier).
Figure 13:
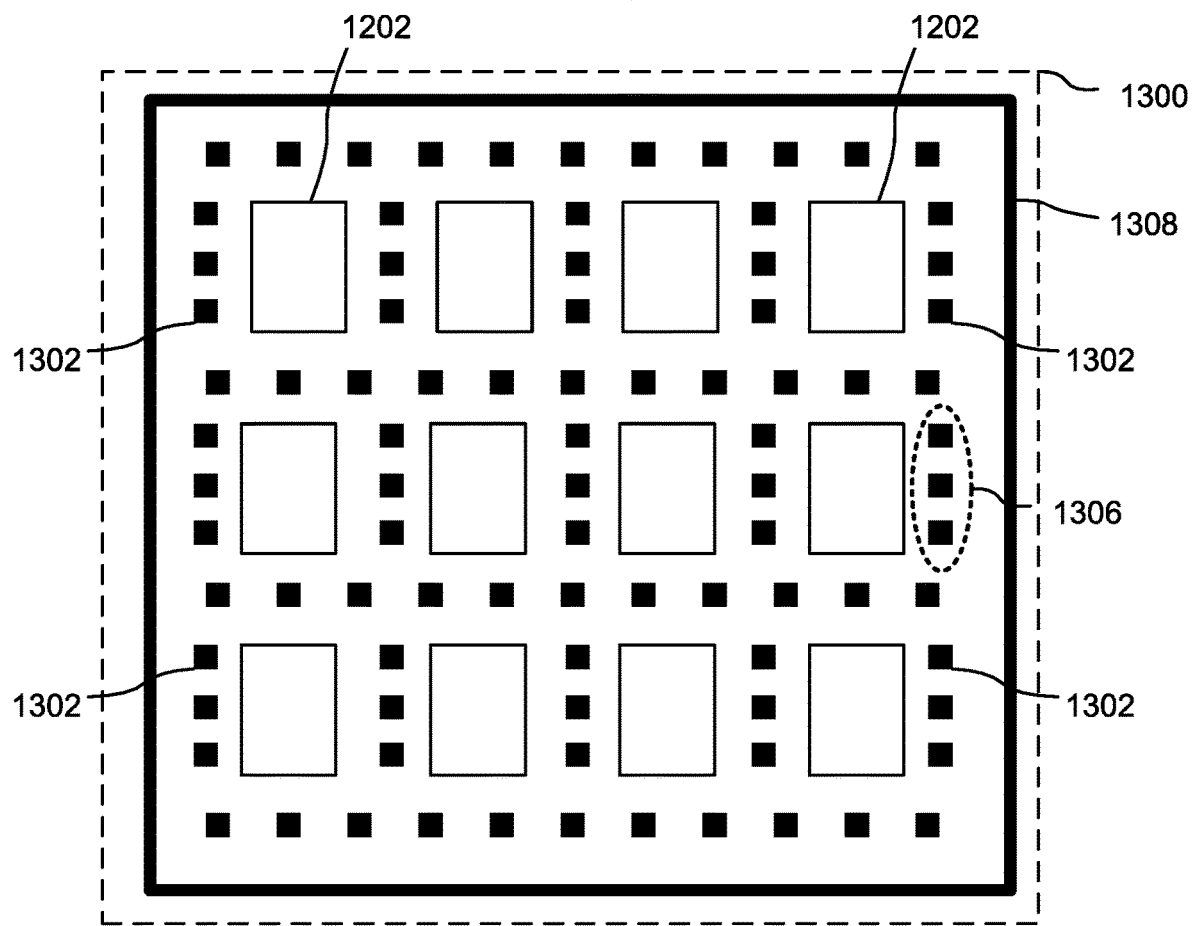
FIG. 13 is a top plan view of an area of a stylized IC that includes the twelve example circuits of FIG. 12 surrounded by a plurality of S-contacts.

In addition to the purposes taught in U.S. patent application Ser. No. 14/964,412 referenced above, S-contacts can be used in conjunction with embodiments of the invention (such as the embodiments described above) to create protected areas on an IC substrate that encompass FETs that are sensitive to accumulated charge effects. For example, FIG. 12 is a top plan view of an area 1200 of a stylized IC that includes twelve example circuits 1202 of a type susceptible to accumulated charge resulting from the interaction of an unmodified trap rich layer 404 and transient changes of state of FETs comprising such circuits (e.g., current mirrors for bias circuits of a power amplifier). FIG. 13 is a top plan view of an area 1300 of a stylized IC that includes the twelve example circuits 1202 of FIG. 12 surrounded by a plurality of S-contacts 1302. As illustrated, S-contacts 1302 substantially surround each circuit 1202, essentially creating corresponding "wells" surrounded by S-contact "rings" (even though not circular). The rings of S-contacts 1302 around the wells reduce substrate impedance and thus settling time of the substrate voltage under the circuits 1202, help in shielding the circuits 1202 from electrical interference (from each other and from other circuits outside the area 1300), help in draining accumulated charge from the high resistivity substrate 402 and/or trap rich layer 404, and help to improve impedance matching for the circuits 1202 within the wells by preventing uneven substrate potential between circuits. However, even a single S-contact near a circuit 1202 may provide a benefit.

Each of the S-contacts 1302 may be electrically connected, directly or through other circuit elements, to the source S or the gate G of a FET. However, when used with embodiments of the present invention, it may be quite beneficial to connect the S-contacts 1302 to circuit ground or to another known potential (even the IC supply voltage, $V_{DD}$), to avoid imposing signals on the S-contacts 1302. Such imposed signals may create accumulated charge in the high resistivity substrate 402 and/or in or near the trap layer 404 and/or elsewhere in the FET (e.g., at the gate, drain, or source of the FET), and may arise, e.g., due to varying voltages applied to active layer 408 elements, such as the source S or gate G of a FET. While a static potential may be most beneficial in some applications, in other applications it may be useful to dynamically change the potential applied to the S-contacts 1302, such as by raising or lowering an applied voltage to counteract accumulated charge that arises during some operational phases (e.g., bursts of signal transmissions in an active mode versus essentially quiescent periods during a standby mode). In some applications, it may be useful to purposefully inject charge into the high resistivity substrate 402 and/or the trap layer 404 by biasing the S-contacts 1302 with a suitable voltage signal. When a potential other than circuit ground is desired, it may be useful use a charge pump or similar means to inject offsetting charge, or apply a negative potential, or apply a positive potential that exceeds the voltage of the IC power supply (e.g., greater than $V_{DD}$).

The size, number, and spacing of the S-contacts 1302 generally is a matter of design choice. However, to improve transient effects, wells defined by the S-contacts 1302 should be small enough such that there are essentially no gradients under large circuits 1202 that might necessitate additional impedance matching. Accordingly, the size of the S-contact rings should be similar in size to the wells of potential formed by the S-contacts. Note that complete encirclement of each circuit 1202 may not be necessary in all applications, and that a partial ring of S-contacts may suffice. For example, S-contacts may be omitted in some applications for edges of circuits 1202 not shared with other close-by circuits 1202, such as the S-contacts shown within the dotted oval 1306 of FIG. 13. Moreover, while individual "island" type S-contacts 1302 are illustrated in FIG. 13, S-contacts can be formed as trenches, in known fashion.

If the S-contacts 1302 are biased in some manner, it may be useful to form a guard ring 1308 of S-contacts around the area 1300 to protect other circuitry; S-contact trenches would work particularly well for such a guard ring 1308, which typically would be grounded.

In addition to the methods taught in U.S. patent application Ser. No. 14/964,412 referenced above, a person skilled in the art will know of many fabrication methods to provide S-contacts suitable for the purposes described in this disclosure.

Figure 14:
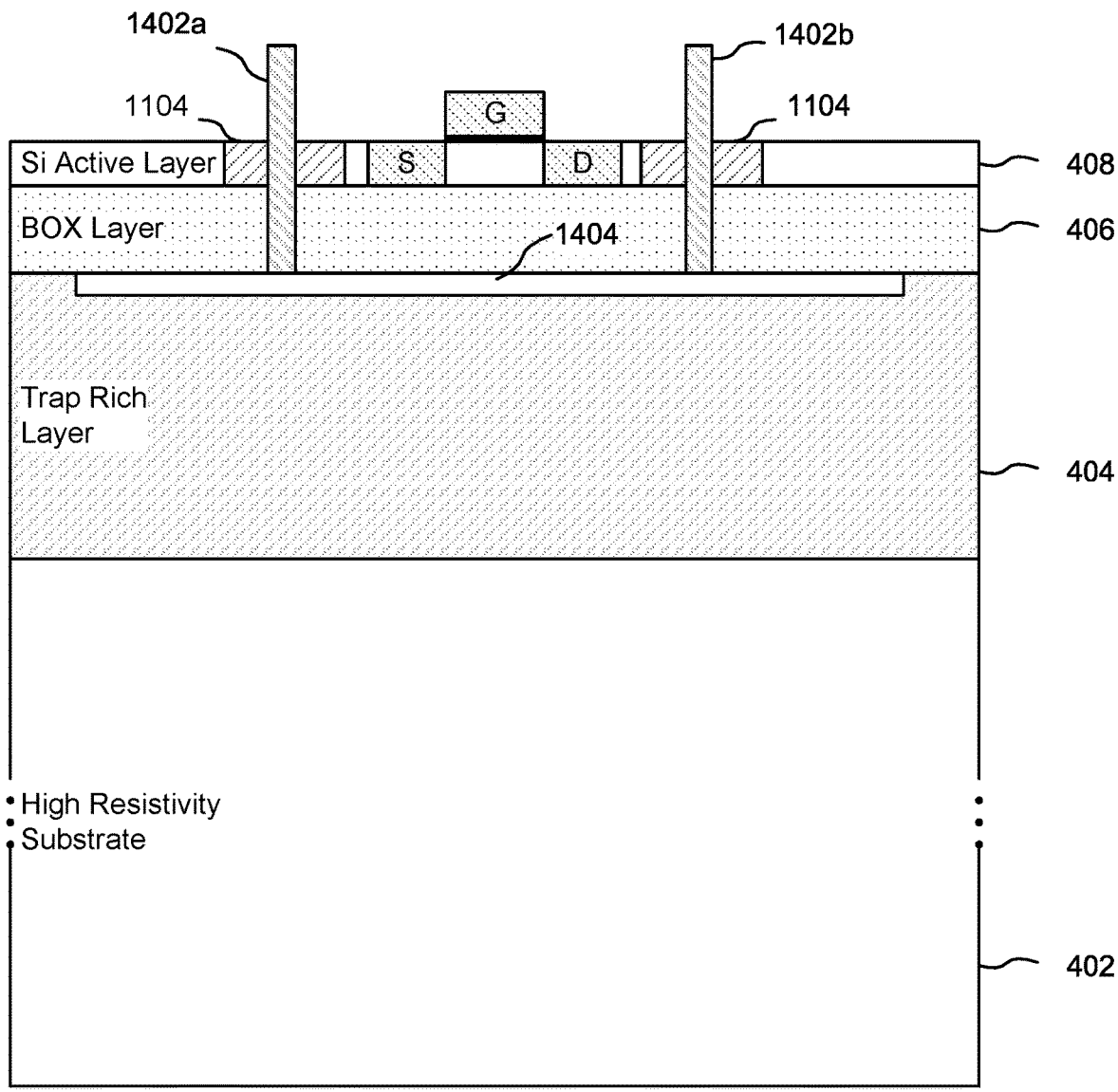
FIG. 14 is block diagram showing an SOI IC structure with a trap rich layer, a BOX insulator layer, and substrate contacts for a single FET.

As an example of combining the above-disclosed concepts, FIG. 14 is block diagram showing an SOI IC structure 1400 with a trap rich layer 404, a BOX insulator layer 406, and substrate contacts for a single FET 410. In the illustrated embodiment, which is otherwise similar to FIG. 11, two S-contacts 1402a, 1402b penetrate through corresponding isolation regions 1104 from the active layer 408 to a modified region 1404 of the trap rich layer 404.

The modified region 1402 may be the result of any of: modification of the trap rich layer 404 characteristics before formation of the BOX insulator layer 406, as described above with respect to FIGS. 6A-6B; modification of the trap rich layer 404 characteristics after formation of the BOX insulator layer 406, as described above with respect to FIGS. 7A-7C; or laser annealing of the trap rich layer 404, as described above with respect to FIGS. 8A-8C. One or more S-contacts may also be used in conjunction with the embodiments shown in FIGS. 5A-5B, 9A-9D, 10A-10C by contacting the high resistivity substrate 402 and/or a trap rich layer 404 or region 502.

By virtue of penetrating through the isolation regions 1104 within the active layer 408, the S-contacts 1402a, 1402b remain isolated from direct contact with other active regions of the active layer 408. The S-contacts 1402a, 1402b may electrically connected, directly or through other circuit elements, to circuit ground or to another known static or dynamic potential, as described above. Modification of the modified region 1402 makes that region more conductive than the trap rich layer 404, allowing accumulated charge to more rapidly dissipate. Since the S-contacts 1402a, 1402b are in electrical contact with the modified region 1402, they can conduct such accumulated charge to a known potential.

Methods

Figure 15:
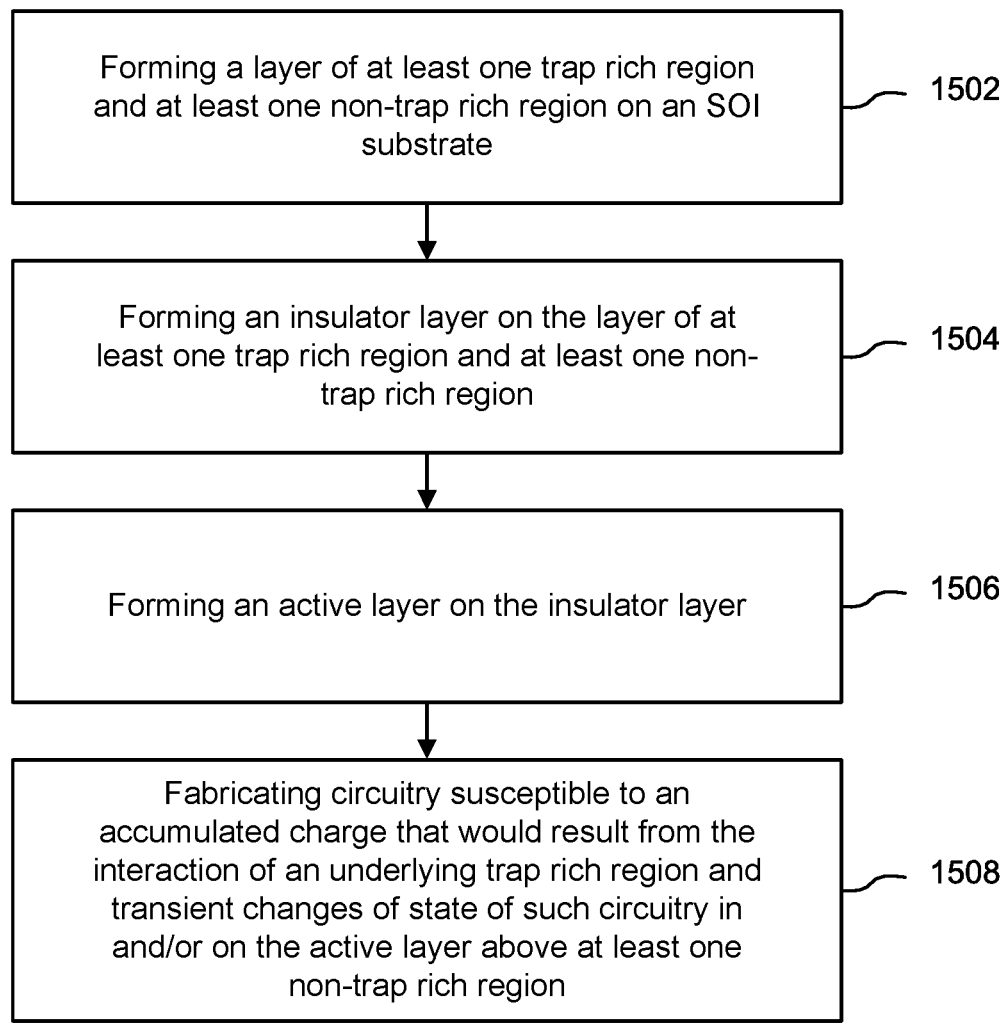
FIG. 15 is a process flow diagram showing a first method for forming a silicon-on-insulator (SOI) integrated circuit on a high resistivity substrate.

Another aspect of the invention includes methods for forming a silicon-on-insulator (SOI) integrated circuit. Following are examples of such methods:

FIG. 15 is a process flow diagram 1500 showing a first method for forming a silicon-on-insulator (SOI) integrated circuit on a substrate, including: forming a layer of at least one trap rich region and at least one non-trap rich region on the substrate (STEP 1502); forming an insulator layer on the layer of at least one trap rich region and at least one non-trap rich region (STEP 1504); forming an active layer on the insulator layer (STEP 1506); and fabricating circuitry susceptible to an accumulated charge that would result from the interaction of an underlying trap rich region and transient changes of state of such circuitry in and/or on the active layer above at least one non-trap rich region (STEP 1508).

Figure 16:
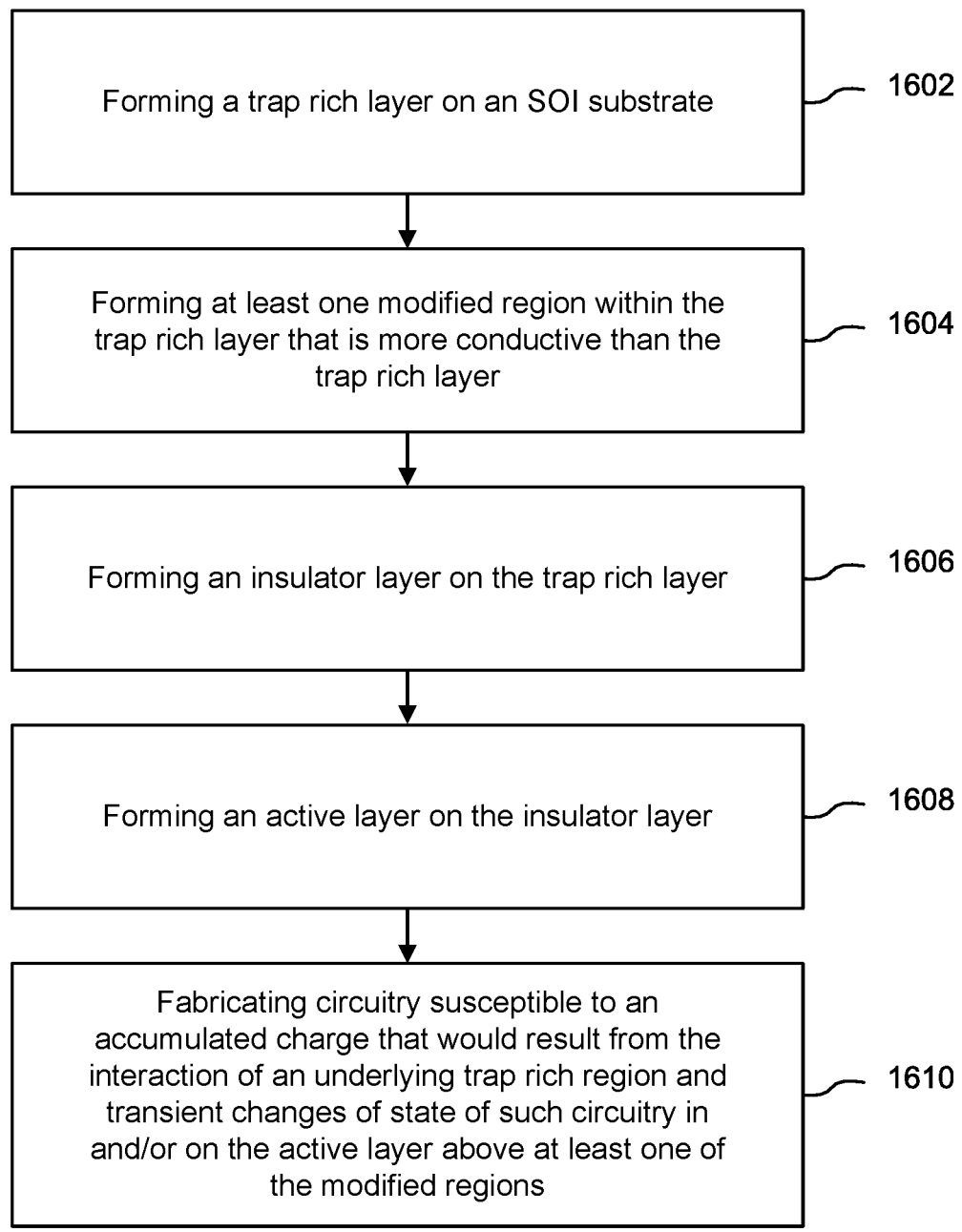
FIG. 16 is a process flow diagram showing a second method for forming a silicon-on-insulator (SOI) integrated circuit on a high resistivity substrate.

FIG. 16 is a process flow diagram 1600 showing a second method for forming a silicon-on-insulator (SOI) integrated circuit on a substrate, including: forming a trap rich layer on the substrate (STEP 1602); forming at least one modified region within the trap rich layer that is more conductive than the trap rich layer (STEP 1604); forming an insulator layer on the trap rich layer (STEP 1606); forming an active layer on the insulator layer (STEP 1608); and fabricating circuitry susceptible to an accumulated charge that would result from the interaction of an underlying trap rich region and transient changes of state of such circuitry in and/or on the active layer above at least one of the modified regions (STEP 1610).

Figure 17:
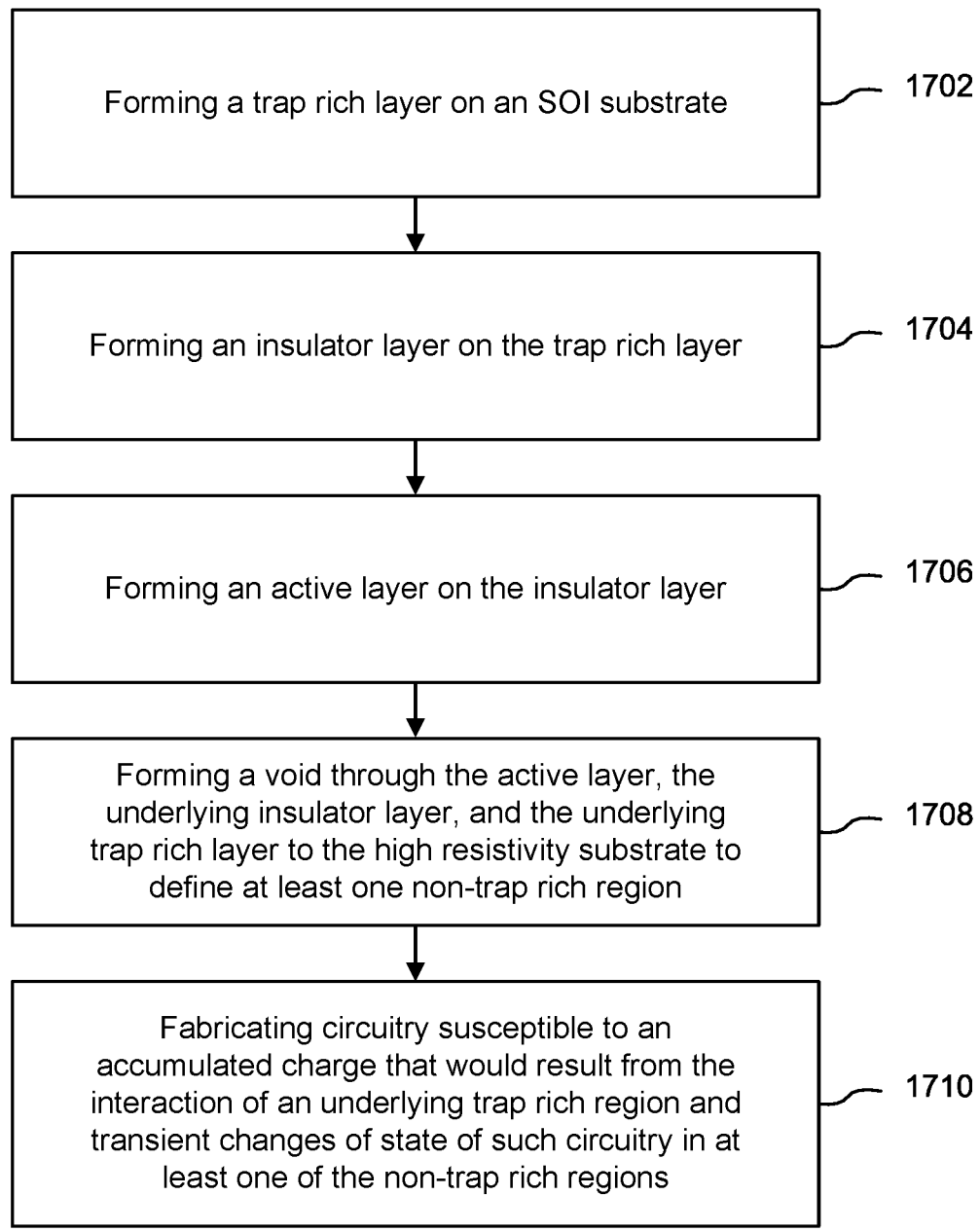
FIG. 17 is a process flow diagram showing a third method for forming a silicon-on-insulator (SOI) integrated circuit on a high resistivity substrate.

FIG. 17 is a process flow diagram 1700 showing a third method for forming a silicon-on-insulator (SOI) integrated circuit on a substrate, including: forming a trap rich layer on the substrate (STEP 1702); forming an insulator layer on the trap rich layer (STEP 1704); forming an active layer on the insulator layer (STEP 1706); forming a void through the active layer, the underlying insulator layer, and the underlying trap rich layer to the substrate to define at least one non-trap rich region (STEP 1708); and fabricating circuitry susceptible to an accumulated charge that would result from the interaction of an underlying trap rich region and transient changes of state of such circuitry in at least one of the non-trap rich regions (STEP 1710).

Figure 18:
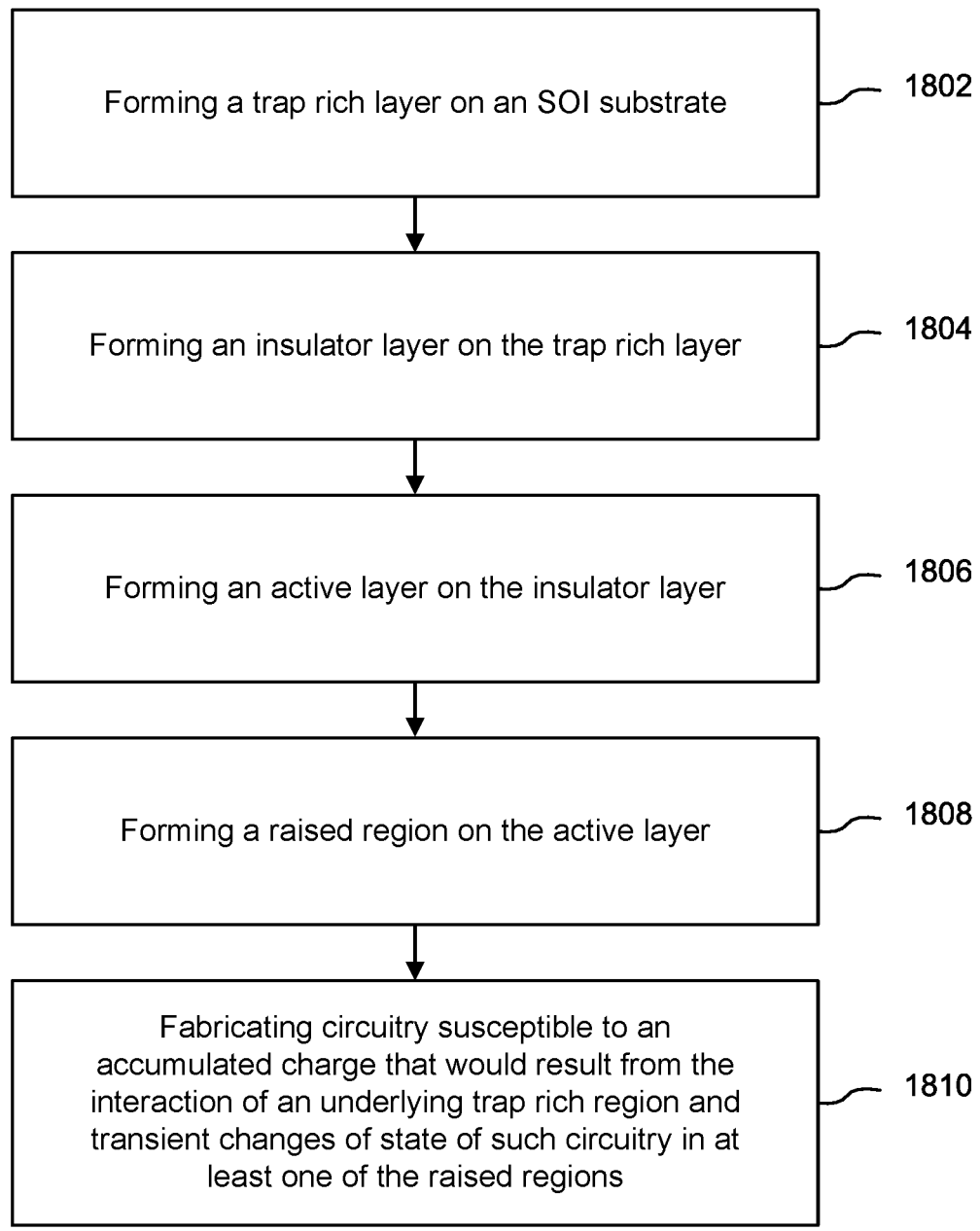
FIG. 18 is a process flow diagram showing a fourth method for forming a silicon-on-insulator (SOI) integrated circuit on a high resistivity substrate.

FIG. 18 is a process flow diagram 1800 showing a fourth method for forming a silicon-on-insulator (SOI) integrated circuit on a substrate, including: forming a trap rich layer on the substrate (STEP 1802); forming an insulator layer on the trap rich layer (STEP 1804); forming an active layer on the insulator layer (STEP 1806); forming a raised region on the active layer (STEP 1808); and fabricating circuitry susceptible to an accumulated charge that would result from the interaction of an underlying trap rich region and transient changes of state of such circuitry in at least one of the raised regions (STEP 1810).

Other aspects of the above methods may include one or more of the following: fabricating circuitry that can benefit from the characteristics of the trap rich region in and/or on the active layer above at least one trap rich region or layer; forming the layer of at least one trap rich region and at least one non-trap rich region by forming a layer of non-trap rich material on the high resistivity substrate, masking and etching through the layer of non-trap rich material to the high resistivity substrate to define at least one region in which trap rich material is to be formed; and forming trap rich material within at least one such region to define the at least one trap rich region; forming the layer of at least one trap rich region and at least one non-trap rich region by forming a layer of trap rich material on the high resistivity substrate, and masking and etching the trap rich material through to the high resistivity substrate to define the at least one non-trap rich region; forming the layer of at least one trap rich region and at least one non-trap rich region by masking the high resistivity substrate to define at least one region in which trap rich material is to be formed, and forming trap rich material within at least one such region to define the at least one trap rich region; forming a filler material within each non-trap rich region before forming the insulator layer on the layer of at least one trap rich region and at least one non-trap rich region; each modified region being formed by implanting or diffusing a dopant into a selected area of the trap rich layer before forming the insulator layer on the trap rich layer; each modified region being formed by implanting a dopant into a selected area of the trap rich layer after forming the insulator layer on the trap rich layer; each modified region being formed by laser annealing a selected area of the trap rich layer after forming the insulator layer on the trap rich layer; forming an epitaxial material on the high resistivity substrate within each void, and fabricating the circuitry susceptible to an accumulated charge that would result from the interaction of an underlying trap rich region and transient changes of state of such circuitry on the epitaxial material; forming one or more (e.g., at least a partial ring) substrate contacts (S-contacts) near or around at least one area of circuitry susceptible to an accumulated charge that would result from the interaction of an underlying trap rich region and transient changes of state of such circuitry and/or the substrate being a high resistivity substrate.

Options and Fabrication Technologies

As one of ordinary skill in the art will appreciate, additional layers and steps may be added to any of the structures shown in FIGS. 5A-18 without deviating from the inventive concepts. Similarly, the order of layer formation may vary without deviating from the inventive concepts. For example, using known layer transfer technologies, a BOX insulator layer 406 and an active layer 408 may be formed on a handle substrate and bonded as a unit to a trap rich layer 404 formed on a high resistivity substrate 402. Such a process is well suited to the practice of the embodiment described above with respect to FIGS. 5A-5B and 6A-6B, since the trap rich layer 502, 404 is easily accessible for processing. Note also that the term "forming" with respect to forming a BOX insulator layer 406 on a trap rich layer 404 or region 502 (or the like) includes any known method, including deposition of material to create the BOX insulator layer 406 and bonding a pre-fabricated BOX insulator layer 406 on a trap rich layer 404 or region 502.

While normally a trap rich layer 404 or region 502 is used in conjunction with a high resistivity substrate 402, the invention has applicability to bulk (low resistivity) substrates on which a trap rich layer 404 or region 502 has been formed (e.g., by a damaging implant). Further, while it is beneficial in general to fabricate FETs that would be susceptible to trap rich related accumulated charge over a non-TR region or layer, such FETs may also be fabricated over a trap rich region or layer in some applications. For example, FET-based circuitry fabricated over a trap rich region or layer may utilize a circuit that compensates for or mitigates the problems of trap rich related accumulated charge, such as the circuits taught in U.S. patent application Ser. No. 15/600,579, filed May 19, 2017, entitled "Transient Stabilized SOI FETs", referenced above. Moreover, in some applications, some RF circuitry may be fabricated over a non-TR region or layer if such circuitry is not overly sensitive to linearity degradation (linearity is benefited by the characteristics of a trap rich region or layer).

A number of the inventive methods described above can be practiced on commercial SOI wafers that come pre-fabricated with a high resistivity substrate 402, a trap rich layer 404, a BOX insulator layer 406, and an active layer 408. Such pre-fabricated wafers are well suited to the practice of the embodiments described above with respect to FIGS. 7B-7C, 8B-8C, 9A-9D, and 10A-10D.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice. Various embodiments of the invention may be implemented in any suitable IC technology (including but not limited to MOSFET and IGFET structures) that exhibits accumulated charge, including (but not limited to) silicon-on-insulator (SOI).

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The term "circuit ground" includes a reference potential, and is not limited to an earth ground or other "hard" ground.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit formed from a silicon-on-insulator (SOI) substrate and having (A) a layer of at least one trap rich region and at least one non-trap rich region formed on the substrate, an insulator layer formed on the layer of at least one trap rich region and at least one non-trap rich region, and an active layer formed on the insulator layer, the active layer above at least one of the at least one non-trap rich region defining a region in and/or on which circuitry susceptible to an accumulated charge that would result from the interaction of an underlying trap rich region and transient changes of state of such circuitry may be fabricated, and (B) at least one substrate contact near at least one area of circuitry susceptible to an accumulated charge that would result from the interaction of an underlying trap rich region and transient changes of state of such circuitry.

2. The invention of claim 1, wherein circuitry that can benefit from the characteristics of the trap rich region is fabricated in and/or on the active layer above at least one trap rich region.

3. The invention of claim 1, wherein the layer of at least one trap rich region and at least one non-trap rich region is formed from a layer of non-trap rich material on the substrate that has been masked and etched through to the substrate to define at least one region in which trap rich material is to be formed, and wherein trap rich material is formed within at least one such region to define the at least one trap rich region.

4. The invention of claim 1, wherein the layer of at least one trap rich region and at least one non-trap rich region is formed from a layer of trap rich material on the substrate that has been masked and etched through to the substrate to define the at least one non-trap rich region.

5. The invention of claim 4, wherein a filler material is formed within each non-trap rich region before the insulator layer is formed on the layer of at least one trap rich region and at least one non-trap rich region.

6. The invention of claim 1, wherein the layer of at least one trap rich region and at least one non-trap rich region is formed on the substrate that has been masked to define at least one region in which trap rich material is to be formed, and wherein trap rich material is formed within at least one such region to define the at least one trap rich region.

7. The invention of claim 6, wherein a filler material is formed on the substrate surrounding the at least one trap rich region to define the at least one non-trap rich region.

8. An integrated circuit formed from a silicon-on-insulator (SOI) substrate having a trap rich layer formed on the substrate, at least one modified region formed within the trap rich layer that is more conductive than the trap rich layer, an insulator layer formed on the trap rich layer, and an active layer formed on the insulator layer, wherein circuitry is fabricated in and/or on the active layer above at least one of the modified regions.

9. The invention of claim 8, wherein circuitry that can benefit from the characteristics of the trap rich layer is fabricated in and/or on the active layer above the trap rich layer.

10. The invention of claim 8, wherein each modified region is formed by implanting or diffusing a dopant into a selected area of the trap rich layer before the insulator layer is formed on the trap rich layer.

11. The invention of claim 8, wherein each modified region is formed by implanting a dopant into a selected area of the trap rich layer after the insulator layer is formed on the trap rich layer.

12. The invention of claim 8, wherein each modified region is formed by laser annealing a selected area of the trap rich layer after the insulator layer is formed on the trap rich layer.

13. The invention of claim 8, wherein each modified region is formed by implanting a dopant into a selected area of the trap rich layer after forming the active layer.

14. The invention of claim 8, wherein each modified region is formed by laser annealing a selected area of the trap rich layer after forming the active layer.

15. An integrated circuit formed from a silicon-on-insulator (SOI) substrate having a trap rich layer formed on the substrate, an insulator layer formed on the trap rich layer, and an active layer formed on the insulator layer, wherein a void is formed through the active layer, the underlying insulator layer, and the underlying trap rich layer to the substrate to define at least one non-trap rich region.

16. The invention of claim 15, wherein circuitry that can benefit from the characteristics of the trap rich layer is fabricated in and/or on the active layer above the trap rich layer.

17. The invention of claim 15, wherein circuitry susceptible to an accumulated charge that would result from the interaction of an underlying trap rich region and transient changes of state of such circuitry is fabricated in at least one of the non-trap rich regions.

18. The invention of claim 17, further including an epitaxial material formed on the substrate within the void, wherein the circuitry susceptible to an accumulated charge that would result from the interaction of an underlying trap rich region and transient changes of state of such circuitry is fabricated on the epitaxial material.

19. An integrated circuit formed from a silicon-on-insulator (SOI) substrate having a trap rich layer formed on the substrate, an insulator layer formed on the trap rich layer, an active layer formed on the insulator layer, and a raised region formed on the active layer, wherein circuitry susceptible to an accumulated charge that would result from the interaction of an underlying trap rich region and transient changes of state of such circuitry is fabricated on or in at least one of the raised regions.

20. The invention of claim 19, wherein circuitry that can benefit from the characteristics of the trap rich layer is fabricated in and/or on the active layer above the trap rich layer.

* * * * *